(12) United States Patent
Tang et al.

(10) Patent No.: US 10,530,347 B2
(45) Date of Patent: Jan. 7, 2020

(54) RECEIVER-SIDE SETUP AND HOLD TIME CALIBRATION FOR SOURCE SYNCHRONOUS SYSTEMS

(71) Applicant: SanDisk Technologies LLC, Addison, TX (US)

(72) Inventors: Tianyu Tang, Milpitas, CA (US); Venkatesh Ramachandra, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/017,286

(22) Filed: Jun. 25, 2018

(65) Prior Publication Data

US 2019/0296723 A1  Sep. 26, 2019

Related U.S. Application Data

(60) Provisional application No. 62/647,396, filed on Mar. 23, 2018.

(51) Int. Cl.
*H03K 5/133* (2014.01)
*G11C 7/22* (2006.01)
*G06F 1/10* (2006.01)
*H03K 5/156* (2006.01)

(52) U.S. Cl.
CPC .............. *H03K 5/133* (2013.01); *G06F 1/10* (2013.01); *G11C 7/222* (2013.01); *H03K 5/1565* (2013.01)

(58) Field of Classification Search
CPC .... G06F 1/00; G06F 1/10; G11C 7/00; G11C 7/222; H03H 11/00; H03H 11/265; H03K 5/00; H03K 5/13; H03K 5/1565; H03K 5/132; H03K 5/133; H03K 5/135
USPC ........................................................ 327/261
See application file for complete search history.

(56) References Cited

U.S. PATENT DOCUMENTS

| 7,036,053 | B2 | 4/2006 | Zumkehr et al. |
| 10,069,496 | B1 * | 9/2018 | Behl ................ H03K 19/00369 |
| 2006/0052961 | A1 | 3/2006 | Best |
| 2007/0008791 | A1 | 1/2007 | Butt et al. |
| 2010/0332921 | A1 | 12/2010 | Schaefer |
| 2011/0216611 | A1 | 9/2011 | Giovannini et al. |
| 2012/0110400 | A1 | 5/2012 | Manohararajah et al. |
| 2013/0155788 | A1 | 6/2013 | Brandl et al. |

* cited by examiner

*Primary Examiner* — Lincoln D Donovan
*Assistant Examiner* — Dave Mattison
(74) *Attorney, Agent, or Firm* — Foley & Lardner LLP

(57) ABSTRACT

A skew correction system includes delay circuits positioned in front of sampling circuitry. A skew correction controller first delays an input clock signal to create hold violations. Then with, with the delay of an input clock signal fixed at a reference delay amount, the skew correction controller delays input data signals first to remove or reduce the hold violations, and then to create setup violations. Based on the delaying, the skew correction controller identifies data valid windows for the input data signals, and in turn, identifies target delay amounts that position a delayed clock signal in target sampling positions.

22 Claims, 7 Drawing Sheets

RECEIVER-SIDE SETUP AND HOLD TIME CALIBRATION FOR SOURCE SYNCHRONOUS SYSTEMS

CROSS-REFERENCE TO RELATED APPLICATIONS

This application claims the benefit of U.S. Provisional Application No. 62/647,396, filed Mar. 23, 2018. The contents of U.S. Provisional Application No. 62/647,396 are incorporated by reference in their entirety.

BACKGROUND

In source synchronous systems, a sending circuit may send both data signals carrying data and a clock signal to a receiving circuit. The receiving circuit may use the clock signal to identify the data values of the data carried by the data signals. In particular, the receiving circuit may determine when to identify levels of data pulses identifying the data values in response to detecting transitions of the clock signal. Ideally, the clock transitions occur at optimal times that optimize the receiving circuit's ability to identify the correct levels of the data pulses. A deviation of the clock transitions from their optimal times may be referred to as skew between the clock signal and the data signal. Too large of skew between the data and clock signals may cause the receiving circuit to incorrectly identify the levels of the data pulses. Increases in frequency of the data and clock signals serve to magnify the problems that skew can have. Thus, as frequencies increase, processes that can correct for skew are increasingly important. At the same time, it is often desirable to communicate data from the sending circuit to the receiving circuit as quick as possible. Thus, efficient skew correction processes that require relatively small overhead may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 2:
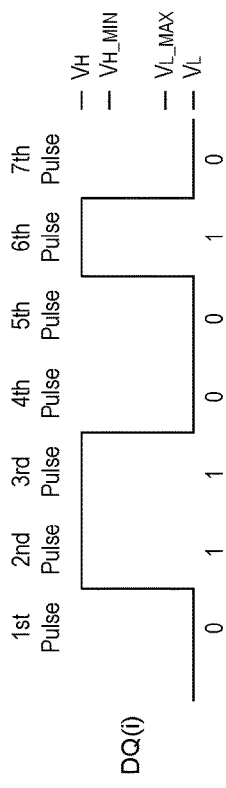
FIG. 2 is an example timing diagram of a waveform of a data signal.

The following embodiments describe systems, apparatuses, devices, circuits, and methods for correcting skew between a clock signal and a plurality of data signals. In one embodiment, a circuit includes a clock delay control circuit, a first data delay control circuit, and a second data delay control circuit. The clock delay control circuit is configured to delay an input clock signal until a clock delay reaches a reference clock delay amount that creates a threshold number of sampling errors. The first data delay control circuit is configured to delay a first input data signal relative to the reference clock delay amount until a first data delay reaches a first target data delay amount. The second data delay control circuit is configured to delay a second input data signal relative to the reference clock delay amount until a second data delay reaches a second target data delay amount.

In some embodiments, a plurality of data delay circuits is configured to delay a plurality of input data signals to generate a plurality of delayed data signals, and sampling circuitry is configured to sample the plurality of delayed data signals with hold violations to create the threshold number of sampling errors.

In some embodiments, the threshold number of sampling errors comprises a plurality of threshold numbers of sampling errors, each for a respective one of a plurality of sampling circuits. In addition, the clock delay control circuit is configured to delay the input clock signal until reaching a last of the plurality of threshold number of sampling errors.

In some embodiments, the threshold number of sampling errors includes a first threshold number of sampling errors, and the first data delay control circuit, to delay the first input data signal, is configured to increase the first data delay relative to the reference clock delay amount. In addition, a delay amount identification circuit is configured to identify a first data delay amount of the first data delay that creates a second threshold number of sampling errors.

In some embodiments, the second data delay control circuit, to delay the second input data signal, is configured to increase the second delay relative to the reference clock delay amount. In addition, the delay amount identification circuit is configured to identify a first data delay amount of the second data delay that creates the second threshold number of sampling errors.

In some embodiments, the first data delay control circuit, to delay the first input data signal, is configured to increase the first delay relative to the reference clock delay amount until the first delay reaches a second data delay amount that creates a third threshold number of sampling errors.

In some embodiments, the first data delay control circuit is configured to delay the first input data signal by the second data delay amount to generate a delayed data signal. In addition, a sampling circuit is configured to sample the delayed data signal with setup violations to create the second threshold number of sampling errors.

In some embodiments, a target data delay calculation circuit is configured to average the first data delay amount and the second data delay amount to determine the first target data delay amount.

In some embodiments, an error identification circuit is configured to determine that an initial sampled data signal includes a second threshold number of sampling errors, and a clock delay control circuit is configured to delay the input clock signal until the clock delay reduces sampling errors to a third threshold number of sampling errors or a maximum delay is reached.

In some embodiments, the clock delay control circuit is configured to, in response to the clock delay reducing the sampling errors to the third threshold number, continue to increase the clock delay until the clock delay reaches the reference clock delay amount.

In some embodiments, the clock delay control circuit is configured to, in response to the maximum delay being reached, reset the clock delay to an initial delay amount, and increase the clock delay to the reference clock delay amount.

In some embodiments, a comparator circuit is configured to compare a sampled bit sequence with a reference bit sequence for a read training process to determine the threshold number of sampling errors.

In some embodiments, an adjustable data delay circuit is configured to delay the first input data signal, where the adjustable data delay circuit includes a plurality of delay blocks, where each delay block includes one of a plurality of delay chains, one of a plurality of bypass paths, and one of a plurality of selection circuits. In addition, the first data delay control circuit is configured to output a pair of complementary selection signals to the selection circuits to either enable or disable each of the plurality of bypass paths.

In another embodiment, a circuit includes a controller configured to receive a plurality of sampling analyses over a plurality of iterations of a skew correction process; during receipt of the sampling analyses, determine a plurality of data valid windows; and calculate average delay amounts for a plurality of data delay circuits from the plurality of data valid windows.

In some embodiments, the controller is configured to increase a delay of an adjustable clock delay circuit until the plurality of sampling analyses identify a threshold number of sampling errors, and identify a reference clock delay amount that produced the threshold number of sampling errors.

In some embodiments, the controller is configured to determine the plurality of data valid windows with reference to the reference clock delay amount.

In some embodiments, the controller is configured to increase delays of the plurality of data delay circuits to identify upper bounds of the plurality of data valid windows.

In some embodiments, the controller is configured to further increase the delays of the plurality of data delay circuits to identify lower bounds of the plurality of data valid windows.

In another embodiment, a system includes an input circuit and a write training controller. The input circuit includes a clock delay circuit and a plurality of data delay circuits. The write training controller is configured to: adjust a clock delay of a clock delay circuit until identifying a first threshold number of sampling errors, and set the clock delay to a reference clock delay amount that produces the first threshold number of sampling errors. Additionally, the write training controller is configured to, with the clock delay set to a reference clock delay amount that produces the first threshold number of sampling errors: adjust data delays of the plurality of data delay circuits to identify a plurality of first data delay amounts that produce a second threshold number of sampling errors, and further adjust the data delays of the plurality of data delay circuits until identifying a plurality of second data delay amounts that produce a third threshold number of sampling errors. Also, the write training controller is configured to determine a plurality of average delay amounts, each based one of the plurality of first data delay amounts and the plurality of second data delay amounts, and set delays of the plurality of data delay circuits each to a respective one of the plurality of average delay amounts.

In some embodiments, a comparator circuit is configured to compare a sampled bit sequence bit with a reference bit sequence for a read training process, and generate a comparison result signal based on the comparison. In addition, the write training controller is configured to adjust the clock delay and the data delays in response to receipt of the comparison result signal.

In another embodiment, a method includes: while maintaining a clock delay of a clock delay circuit and receiving an input clock signal and a plurality of input data signals: increasing delays, with a controller, of a plurality of data delay circuits; upon increasing the delays to first delay amounts, identifying, with the controller, a reduction of hold violations to a threshold number; recording, with the controller, the first delay amounts; upon increasing the delays to second delay amounts, identifying, with the controller, a threshold number of setup violations; and determining, with the controller, target delay amounts based on the first delay amounts and the second delay amounts.

In another embodiment, a circuit includes: a means for delaying an input clock signal until a clock delay reaches a reference clock delay amount that creates a threshold number of sampling errors; a means for delaying a first input data signal relative to the reference clock delay amount until a first data delay reaches a first target data delay amount; and a means for delaying a second input data signal relative to the reference clock delay amount until a second data delay reaches a second target data delay amount.

Other embodiments are possible, and each of the embodiments can be used alone or together in combination. Accordingly, various embodiments will now be described with reference to the attached drawings.

Figure 1:
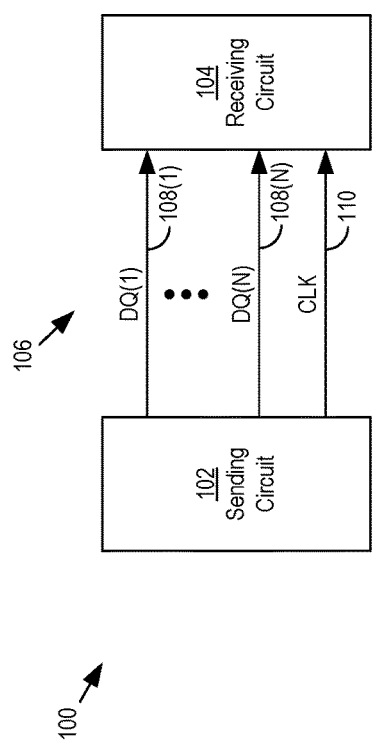
FIG. 1 is a block diagram of an example system that includes a sending circuit and a receiving circuit.

FIG. 1 shows a system 100 that includes a system in which one or more data/clock alignment circuits may be implemented. The system 100 may include a sending circuit 102 and a receiving circuit 104 configured to communicate with each other via a communications bus 106. In particular example configurations, both the sending circuit 102 and the receiver circuit 104 are transceiver circuits—each can be configured to transmit and receive signals. For simplicity, with reference to FIG. 1, one of the circuits 102 is designated as the circuit configured to send signals (i.e., the sending circuit 102) and the other circuit 104 is designated as the circuit configured to receive signals (i.e., the receiving circuit 104).

Additionally, in particular example configurations, each of the sending circuit 102 and the receiving circuit 104 are integrated circuits (IC). In general, an integrated circuit (IC)—also referred to as a monolithic IC, a chip, or a microchip—is an assembly or a collection of electric circuit components (including active components, such as transistors and diodes, and passive components, such as capacitors and resistors) and their interconnections formed as a single unit, such as by being fabricated, on a substrate typically made of a semiconductor material such as silicon. For such embodiments, the sending circuit 102 and the receiving circuit 104 are separated integrated circuits, and the communication bus 106 is configured to communicate signals external to the separate sending circuit (IC) 102 and the receiving circuit (IC) 104.

The sending circuit 102 is configured to send a clock signal CLK and a plurality of data signals DQ to the receiving circuit 104 via a communications bus 106. Otherwise stated, the receiving circuit 104 is configured to receive a clock signal CLK and a plurality data signals DQ from the sending circuit 102 via the communications bus 106. The plurality of data signals DQ is shown in FIG. 1 as including an N-number of data signals DQ(1) to DQ(N), where N is two or more. For particular example configurations, N is 8, although other integer numbers of two or more may be possible for other example configurations.

From the perspective of the sending circuit 102, the clock signal CLK is an output clock signal, and the data signals DQ are output data signals in that they are the clock and data signals that the sending circuit 102 outputs to the receiving circuit 104. From the perspective of the receiving circuit 104, the clock signal CLK is an input clock signal, and the data signals DQ are input data signals in that they are the clock and data signals that the receiving circuit 104 receives from the sending circuit 102. For clarity, the clock signal CLK and the data signals DQ are hereafter referred to as input clock and data signals in that much of the description below pertains to skew correction, clock/data alignment, and write training performed from the perspective of the receiving circuit 104.

The communications bus 106 includes an N-number of data lines 108(1) to 108(N) extending in parallel between the sending circuit 102 and the clock circuit 104. The sending circuit 102 is configured to send the N-number of input data signals DQ(1) to DQ(N) simultaneously and/or in parallel over the N-number of data lines 108(1) to 108(N) to the receiving circuit 104. Otherwise stated, the receiving circuit 104 is configured to receive the N-number of input data signals DQ(1) to DQ(N) simultaneously and/or in parallel from over the N-number of data lines 108(1) to 108(N).

In addition, the communications bus 106 includes one or more clock lines 110 extending in parallel with the N-number of data lines 108(1) to 108(N) between the sending circuit 102 and the receiving circuit 104. As described in further detail below, the input clock signal CLK may include a single-ended clock signal or a pair of complementary clock signals (e.g., CLK and CLKB). Where the input clock signal CLK is a single-ended clock signal, the one or more clock lines 110 includes a single clock line extending in parallel with the data lines 108. Where the input clock signal CLK is a pair of complementary clock signals CLK, CLKB, the one or more clock lines 110 includes two clock lines extending in parallel with each other and with the data lines 108. The sending circuit 102 may be configured to transmit each clock signal CLK, CLKB of the complementary pair over a respective one of the two clock lines 110. The receiving circuit 104 is configured to receive the input clock signal CLK—either as a single-ended clock signal or as a pair of complementary clock signals—simultaneously and/or in parallel with the N-number input of data signals 108(1) to 108(N).

The sending circuit 102 and the receiving circuit 104 form a source synchronous system 100. A source synchronous system is a system in which a source circuit sends a data signal along with a clock signal to a destination circuit in order for the destination circuit to use the clock signal to identify the data values of the data signal. In the system 100, the sending circuit 102 is the source circuit, and the receiving circuit 104 is the destination circuit. However, as transceiver circuits, the sending circuit 102 and the receiving circuit 104 may change roles. For example, in certain operations, the circuit 104 is the circuit of the system 100 that sends a clock signal and a data signal to the circuit 102, and the circuit 102 uses the clock signal to identify the data values of the data signal. For such operations, the circuit 104 becomes the sending or the source circuit, and the circuit 102 becomes the receiving or the destination circuit.

In general, a signal, such as the input clock signal CLK and the input data signals DQ may be at a level at a given point in time. As used herein, a level of a signal is a magnitude value, such as a voltage magnitude value or a current magnitude value. In some cases, the signal may be referred to as being at a high level or at a low level, transitioning between a high level and a low level, or transitioning between a low level and a high level. In general, a high level and a low level are both magnitude values, where the high level is higher in magnitude than the low level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

In addition or alternatively, a high level of a signal is a level that is at or above a minimum high level $V_{H\_MIN}$, and a low level of the signal is a level that is at or below a maximum low level $V_{L\_MAX}$. The minimum high level $V_{H\_MIN}$ and the maximum low level $V_{L\_MIN}$ may be predetermined levels or values, and in particular example configurations, predetermined levels or values specified as part of a swing requirement with which the source circuit 102 is configured to comply when transmitting the signal. A signal that transitions according to and/or in compliance with the swing requirement transitions to a high level that is at or above the minimum high level $V_{H\_MIN}$ of the swing requirement, and transitions to a low level that is at or below the maximum low level $V_L$ Max of the swing requirement.

In general, a signal performs transitions between its high level and its low level. A given transition of a signal may be one of two transition types, including a rising transition and a falling transition. A signal performs a rising transition when the signal transitions from its low level to its high level, and performs a falling transition when the signal transitions from its high level to its low level.

A portion of a magnitude waveform of a signal over a transition is referred to as an edge. In particular, a portion of the magnitude waveform over a rising transition is a rising edge and a portion of the magnitude waveform over a falling transition is a falling edge.

Also, a clock signal, such as the input clock signal CLK, is a signal that has repetitive cycles occurring over successive periods T. Within each period T, a first portion of a respective cycle occurs first in time and a second portion of the respective cycle occurs second in time—i.e., after the first portion. After the second portion of one cycle occurs, the first portion of a next cycle occurs. Within a cycle, one of the portions is at a high level and the other portion is at a low level. Accordingly, the portions may be defined by consecutive rising and falling transitions or edges of the clock signal. For example, a given rising edge or a given falling edge may define or mark a boundary when one portion ends and a next portion, either of the same cycle or of a next cycle, begins.

In addition, a clock signal may include clock pulses that are formed or defined by the rising and falling edges of the clock signal. In particular example configurations, the clock pulses of a clock signal correspond to the high level of the clock signal, in that each clock pulse is defined by a rising edge followed by a period where the clock signal is at its high level, and then followed by a falling edge. A pulse width of a given clock pulse is a time duration extending from a time that the magnitude of the rising edge of the clock pulse is at or rises to a predetermined level (e.g., 50% of the high level) to a time that the magnitude of the falling edge of the clock pulse is at or falls to the predetermined level. The clock pulses of the clock signal may occur according to the frequency of the clock signal.

In addition, a clock signal may have an associated duty cycle. As used herein, a duty cycle of a clock signal is the percentage or fraction of one period that the clock signal is at its high level. In addition or alternatively, the duty cycle of a clock signal is the ratio of a pulse width of a clock pulse in a single period or cycle of the clock signal to a total time duration of the period or cycle.

Additionally, a data signal is a signal that carries and/or includes data. The data carried by and/or included in a data signal includes a bit sequence of bits, where each bit includes or has a single-bit logic value of "1" or "0". The data signal may include a series or sequence of data pulses corresponding to a bit sequence of the data. A data pulse is a portion of the magnitude waveform of the data signal that represents one or more bits of the bit sequence. Each data pulse may be at a level that indicates a data value, otherwise referred to as a logic level or a logic value. In addition, each data value is represented by a binary number or a binary value that includes one or more digits corresponding to and/or representing the one or more bits of the bit sequence. A duration of a data pulse is an amount of time that the level of the data pulse indicates the data value that the data pulse represents.

FIG. 2 shows a timing diagram of magnitude waveform of at least a portion of an example ith data signal DQ($i$) representative of at least a portion of one of the N-number of input data signals DQ(1) to DQ(N). For purposes of illustration, the ith data signal DQ($i$) shown in FIG. 2 includes seven data pulses. Each data pulse is shown as being either at a high level at or above a minimum high level $V_{H\_MIN}$ or at a low level at or below a maximum low level $V_{L\_MAX}$. For the example data signal DQ($i$) in FIG. 2, the high level and the low level each indicate a single-bit logic value of "1" or "0", where the high level corresponds to and/or indicates a single-bit logic value of "1" (otherwise referred to as a logic 1 value) and the low level corresponds to and/or indicates a single-bit logic value of "0" (otherwise referred to as a logic 0 value). Other example data signals where different levels of the magnitude waveform correspond to and/or indicate multi-bit logic values (i.e., logic values that each include two or more digits or bits) may be possible.

For two consecutive data pulses of the ith data signal DQ($i$), where the two consecutive pulses correspond to different logic levels, the data signal DQ($i$) performs a rising transition or a falling transition to transition between the two consecutive data pulses. For the example shown in FIG. 2, where one pulse in the sequence indicates a logic 0 value and a next pulse in the sequence indicates a logic 1 value, the ith data signal DQ($i$) performs a rising transition to transition between the first and second pulses. On the other hand, where one pulse corresponds to a logic 1 value and a next pulse indicates a logic 0 value, the ith data signal DQ($i$) performs a falling transition to transition between the first and second pulses. In addition, where two consecutive pulses indicate the same logic level, then as the pulse sequence transitions from the first data pulse to the next data pulse, the level of the ith data signal DQ($i$) stays the same during those two pulses, and a rising transition or a falling transition may not occur. Regardless of whether a change in level of the ith data signal DQ($i$) occurs when transitioning between two consecutive data pulses, the start of a given data pulse is referred to as a starting transition of the data pulse, and the end of a given data pulse is referred to as an ending transition of the data pulse.

Referring back to FIG. 1, the receiving circuit 104 may include sampling circuitry that performs sampling actions to identify data values of data carried by the input data signals DQ. Sampling circuitry includes a single sampling circuit or a plurality of sampling circuits that perform sampling actions. As used herein, a sampling action is an action performed to determine, identify, detect, capture, obtain, or latch onto, a level or magnitude of a signal at a given point in time. A circuit that performs sampling actions is referred to as a sampling circuit, and the signal on which the sampling circuit performs a sampling action is referred to as an input signal of the sampling circuit. A sampling circuit performing a sampling action on an input signal may include an input terminal configured to receive the input signal. In addition, a sampling circuit performing a sampling action may output or present the level of the input signal that it identifies. The sampling circuit may do so by generating an output signal at an output terminal of the sampling circuit at a level that indicates or corresponds to the level of the input signal that the sampling circuit identifies at its input terminal. Accordingly, a sampling circuit samples an input signal, samples a level of the input signal, or performs a sampling action on an input signal by identifying a level of an input signal and outputting an output signal at a level indicating the level of the input signal that it identifies.

In particular example configurations, the sampling circuit generates its output signal at a level that matches, directly corresponds to, or is equal in value to the level of the input signal that it identifies. For example, if the sampling circuit identifies its input signal at a low level, then the sampling circuit performs a sampling action by generating its output signal at its output terminal at a low level, and if the sampling circuit identifies its input signal at a high level, then the sampling circuit performs a sampling action by generating its output signal at its output terminal at a high level.

In addition, a sampling circuit performs sampling actions in response to detecting sampling transitions. A sampling transition is a transition of a signal that causes or triggers a sampling circuit to perform a sampling action. A sampling transition may be of a particular type, such as a rising transition or a falling transition, although in some embodiments, sampling transitions may include both rising transitions and falling transitions. Each time a sampling circuit detects a sampling transition, the sampling circuit performs a sampling transition. In this context, the number of sampling actions a sampling circuit performs over a given time period equals the number of sampling transitions the sampling circuit detects.

In general, sampling circuits detect sampling transitions of clock signals. Otherwise stated, a sampling circuit uses rising transitions, falling transitions, or both as a timing mechanism to determine when to perform sampling actions. The sampling circuit detects the rising transitions, falling edges, or both, of a clock signal as sampling transitions, and performs a sampling action each time the sampling circuit detects a sampling transition of the clock signal. The input signal that a sampling circuit samples is referred to as its input data signal, and the output signal that a sampling circuit generates and outputs in response to performing sampling actions on the input signal is referred to as its output data signal.

In further detail with respect to FIG. 1, the sampling circuitry of the receiving circuit 104 may determine when to sample levels of the input data signals DQ according to the sampling transitions of the input clock signal CLK. The sending circuit 102 may send the input clock signal CLK and the input data signals DQ such that each data pulse of each of the data signals DQ corresponds to and/or is associated with an associated sampling transition of the input clock signal CLK. This way, when the sampling circuitry of the receiving circuit 104 receives the clock signal CLK and the input data signals DQ, the sampling circuitry samples each data pulse in response to identifying each of the associated sampling transitions of the input clock signal CLK.

The sampling circuitry of the receiver circuit 104 may include a plurality, such as an N-number, of sampling circuits. Each of the N-number of sampling circuits is configured to sample the levels of a respective one of the N-number of data signals DQ(1) to DQ(N). An example sampling circuit is a flip flop, such a D flip flop for example.

Figure 3:
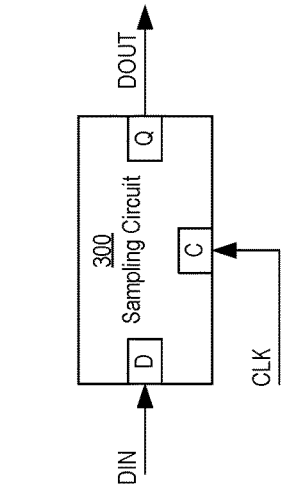
FIG. 3 is a block diagram of an example sampling circuit.

FIG. 3 is a block diagram of an example sampling circuit, such as a flip flop or a latch, 300. The sampling circuit 300 includes a data input terminal or node D, a data output terminal or node Q, and a clock input terminal or node C. The data input terminal D is configured to receive an input data signal DIN of which the sampling circuit 300 is configured to sample levels. The clock input terminal C is configured to receive a clock signal CLK of which the sampling circuit 300 is configured to detect sampling transitions. The data output terminal Q is configured to output an output data signal DOUT at levels and at times based on the levels of the input data signal DIN and the sampling transitions of the clock signal CLK. In particular, the sampling circuit 300 is configured to detect when each of the sampling transitions of the clock signal CLK occur. When the sampling circuit 300 detects that a sampling transition occurs, the sampling circuit 300 samples the level of the input data signal DIN at the data input terminal D, and generates the output data signal DOUT at the level of the input data signal DIN that the sampling circuit 300 identified. The sampling circuit 300 maintains or holds the output data signal DOUT at the data output terminal Q at the level it identified until it detects the next sampling transition of the clock signal CLK. Upon detecting the next sampling transition of the clock signal CLK, the sampling circuit 300 will again identify the level of the input data signal DIN at the data input terminal D, and generate the output data signal DOUT at the level of the input data signal DIN that the sampling circuit 300 identified in response to the next sampling transition. The sampling circuit 300 may continue to operate in this manner as it continues to receive additional data pulses of the input data signal DIN and detect sampling transitions of the clock signal CLK.

For a given data pulse of the input data signal DIN that the sampling circuit 300 samples, the sampling circuit 300 may either sample the data pulse correctly or sample the data pulse incorrectly. The sampling circuit 300 correctly samples a data pulse of the input data signal DIN when it generates the output data signal DOUT at a level that correctly or accurately indicates the level of the input data signal DIN at its data input terminal D at the time the sampling circuit 300 detects a sampling transition of the clock signal CLK. For example, the sampling circuit 300 correctly samples a data pulse of the input data signal DIN when it generates the output data signal DOUT at a level that matches the level input data signal DIN at the time the sampling circuit 300 detects a sampling transition of the clock signal CLK.

In addition, the sampling circuit 300 incorrectly samples a data pulse of the input data signal DIN when it generates the output data signal DOUT at a level that incorrectly or inaccurately indicates the level of the input data signal DIN at its data input terminal D at the time the sampling circuit 300 detects a sampling transition of the clock signal CLK. For example, the sampling circuit 300 incorrectly samples a data pulse of the input data signal DIN when it generates the output data signal DOUT at a level that does not match or mismatches the level input data signal DIN at the time the sampling circuit 300 detects a sampling transition of the clock signal CLK.

The sampling circuit 300 performs sampling errors when the sampling circuit 300 incorrectly samples the input data signal DIN. As used herein, a sampling error is a result that a sampling circuit produces, generates, makes, or outputs in response to incorrectly sampling a level of an input data signal. A sampling circuit may exhibit the sampling error by outputting a data pulse of its output data signal at a level that indicates a bit value of a particular bit in a bit sequence carried by the output data signal that is different than the bit value of the particular bit in the bit sequence as carried by the input data signal to the sampling circuit. In some example situations, a sampling circuit may generate a sampling error by missing a data pulse of the input data signal, such as by not detecting a sampling transition of the clock signal during a duration of the data pulse. In other example situations, a sampling circuit may generate a sampling error by generating its output data signal at the incorrect or opposite logic level from which the input data signal is at when the sampling circuit detects a sampling transition of the clock signal. In either situation, when the sampling circuit generates at least one sampling error, the output data signal that the sampling circuit generates will have or represent a bit sequence that indicates one or more different logic levels or bit levels compared to the bit sequence that the input signal has or represents. The number of different logic or bit levels is equal to the number of sampling errors that the sampling circuit makes.

A measure of a sample circuit's ability to correctly sample data signals may be quantified by a sampling error rate, which is a number of sampling errors that occurred for a given number of sampling actions performed. A sampling error rate may be quantified for a given number of sampling actions that a single sampling circuit performs, or for a given number of sampling actions that a plurality of sampling circuits of sampling circuitry perform.

In addition, the sampling circuit 300 has setup time and hold time requirements that the timing of the data pulses of the input data signal DIN and the sampling transitions of the clock signal CLK must meet in order for the sampling circuit 300 to accurately sample the data pulses of the input data signal DIN. The sampling circuit 300 accurately samples a given number of data pulses of the input data signal DIN when it generates data pulses of the output data signal DOUT at levels that accurately or correctly indicate, such as by matching, the levels of the given number of data pulses of the input data signal DIN—i.e., generates the output data signals without making sampling errors when sampling the given number of data pulses. For example, the sampling circuit 300 accurately samples a data pulse of the input data signal DIN when it generates the output data signal DOUT at a level that accurately or correctly indicates, such as by matching, the level of the data pulse of the input data signal DIN in response to detecting a sampling transition of the clock signal. Additionally, the sampling circuit 300 accurately samples two consecutive data pulses of the input data signal DIN that transition between different levels (e.g., a high level followed by a low level, or a low level followed by a high level) when it tracks, follows, or otherwise accounts for the transition in level by transitioning the level of the output data signal DOUT to accurately or correctly indicate, such as by matching, the transition in level of the two consecutive data pulses when the sampling circuit 300 detects a sampling transition of the clock signal CLK.

The setup time requirement is the minimum amount of time required for a data pulse of the input data signal DIN to be stable at the data input terminal D before the sampling circuit 300 detects a sampling transition of the clock signal CLK in order for the sampling circuit 300 to reliably identify the level of the data pulse. When a data pulse of the input data signal DIN is stably at a level that indicates the data value that the data pulse represents for a time period equal to or longer than the setup time amount, the data pulse, or more generally the input data signal DIN, meets or satisfies the setup time requirement of the sampling circuit 300. Alternatively, when the data pulse of the input data signal DIN is not stably at the level that indicates the data value that the data pulse represents for a time period equal to or longer than the setup time amount, the data pulse, or more generally the input data signal DIN, fails the setup time requirement of the sampling circuit 300. Where the sampling circuit 300 receives data pulses of the input data signal DIN that fail the setup time requirement, the sampling circuit 300 experiences or exhibits, setup violations. A setup violation is a failure of a data pulse to be stably at its level at the data input terminal D for a time duration greater than or equal to the setup time requirement.

A sampling circuit that receives data pulses at its data input terminal D that satisfy the setup time requirement reliably samples the data pulses in that the sampling circuit accurately or correctly samples the data pulses at or above an expected or predetermined confidence level or percentage. Alternatively, a sampling circuit that receives data pulses at its data input terminal D that fail the setup time unreliably samples the data pulses in that the sampling circuit accurately or correctly samples the data pulses below an expected or predetermined confidence level or percentage. At a minimum, a sampling circuit that receives data pulses at its data input terminal that satisfy the setup time requirement samples the data pulses at a lower sampling error rate than a sampling circuit that receives data pulses at its data input terminal that violate the setup time requirement.

The hold time requirement is the minimum amount of time for a data pulse of the input data signal DIN to be stable at the data input terminal D after the sampling circuit 300 detects a sampling transition of the clock signal CLK in order for the sampling circuit 300 to reliably identify the level of the data pulse. When a data pulse of the input data signal DIN is stably at a level that indicates the data value that the data pulse represents for a time period equal to or longer than the hold time amount, the data pulse, or more generally the input data signal DIN, meets or satisfies the hold time requirement of the sampling circuit 300. Alternatively, when the data pulse of the input data signal DIN is not stably at the level that indicates the data value that the data pulse represents for a time period equal to or longer than the hold time amount, the data pulse, or more generally the input data signal DIN, fails the hold time requirement of the sampling circuit 300. Where the sampling circuit 300 receives data pulses of the input data signal DIN that fail the hold time requirement, the sampling circuit 300 experiences hold violations. A hold violation is a failure of a data pulse to be stably at its level at the data input terminal D for a time duration greater than or equal to the hold time requirement.

A sampling circuit that receives data pulses at its data input terminal D that satisfy the hold time requirement reliably samples the data pulses in that the sampling circuit accurately or correctly samples the data pulses at or above an expected or predetermined confidence level or percentage. Alternatively, a sampling circuit that receives data pulses at its data input terminal D that fail the hold time requirement unreliably samples the data pulses in that the sampling circuit accurately or correctly samples the data pulses below an expected or predetermined confidence level or percentage. At a minimum, a sampling circuit that receives data pulses at its data input terminal that satisfy the hold time requirement samples the data pulses at a lower sampling error rate than a sampling circuit that receives data pulses at its data input terminal that violate the hold time requirement.

Figure 4:
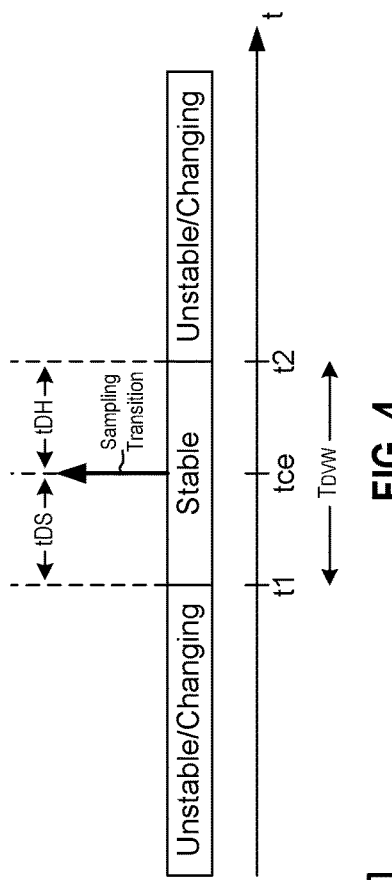
FIG. 4 is a schematic diagram of setup and hold time requirements of the sampling circuit of FIG. 3.

FIG. 4 is a schematic diagram illustrating setup time and hold time requirements of the sampling circuit 300. A sampling transition of the clock signal CLK is shown as occurring at a clock event time tce. An occurrence of a sampling transition of the clock signal CLK may be referred to as a clock event. When the sampling circuit 300 detects a sampling transition, it detects a clock event. A time duration from a first time t1 to the clock event time tce denotes the setup time tDS, and a time duration from the clock event time tce to a second time denotes the hold time tDH. In order to meet the setup and hold requirements of the sampling circuit 300, the level of a data pulse of the input data signal DIN should be stable from the first time t1 to the second time t2. A setup violation occurs when the level of input data signal DIN is unstable (it is still changing) after the first time t1 occurs. In other words, a setup violation occurs when the actual amount of time that the level of the input data signal DIN is stable before occurrence of the sampling transition at the clock event time tce is less than the amount of the setup time tDS. In addition, a hold violation occurs when the level of the input data signal DIN is unstable (it changes) before the second time t2. In other words, a hold violation occurs when the actual amount of time that the level of the input data signal DIN is stable after occurrence of the sampling transition at the clock event time tce is less than the amount of the hold time tDH.

For a data pulse of the input data signal DIN that the sampling circuit 300 is to sample, at least a portion of the duration that a level of the data pulse is stable—e.g., at least a portion of the duration that the data pulse is at the high level or at the low level—defines a data valid window $T_{DVW}$. A data valid window $T_{DVW}$ is a time period or duration over which a given data pulse occurs during which a sampling circuit is to detect a sampling transition of the clock signal in order to avoid a setup violation and a hold violation. If the sampling transition occurs before the start of the data valid window $T_{DVW}$, then a setup violation occurs—either because the sampling transition occurred before the starting transition of the data pulse, or because the sampling transition occurred too close to after the starting transition that the actual amount of time that the level of the data pulse is stable before occurrence of the sampling transition is less than the setup time tDS. In addition, if the sampling transition occurs after the end of the data valid window $T_{DVW}$, then a hold violation occurs—either because the sampling transition occurred after the ending transition of the data pulse or occurred too close to before the ending transition that the actual amount of time that the level of the data pulse is stable after occurrence of the sampling transition is less than the hold time tDH.

Ideally, the sampling circuit 300 receives the clock signal CLK and the input data signal DIN relative to each other such that the sampling circuit 300 reliably or accurately samples the level of each data pulse in order to correctly identify the data value that each data pulse represents. Configuring the sampling circuit 300 to sample each data pulse in the middle or at a middle point of the duration of each pulse may maximize the chances of this ideal situation occurring. The ideal time at which to sample a data pulse is referred to as a target sampling time of the data pulse. Ideally, the sampling circuit 300 identifies sampling transitions in the middle of the durations of the data pulses and/or at the target sampling times of the data pulses. Accordingly, a given sampling transition is in a target sampling position when the sampling transition occurs at the target sampling time of its associated data pulse.

Figure 5:
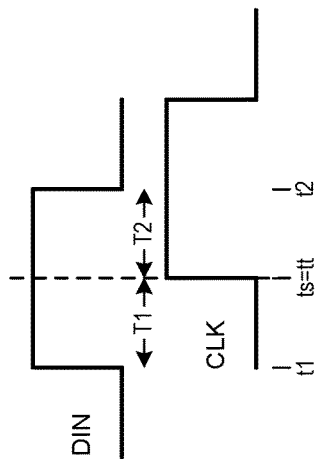
FIG. 5 is a timing diagram of a sampling transition of a clock signal in a target sampling position.

FIG. 5 shows a data pulse of the input data signal DIN and a pulse of the clock signal CLK, illustrating the ideal case where a sampling transition of the clock pulse is in the target sampling position. In FIG. 5, a starting transition of the data pulse occurs at a first time t1, and an ending transition of the data pulse occurs at a second time t2. A target sampling time tt of the data pulse occurs in the middle between the first time t1 and the second time t2. Accordingly, a first time period T1 extending from the first time t1 to the target sampling time tt is the same as or equal to a second time period T2 extending from the target sampling time tt to the second time t2. Additionally, the sampling transition associated with the data pulse is the rising transition of the clock pulse. The sampling transition occurs at a sampling time ts. In FIG. 5, for the ideal case, the sampling transition occurs at the target sampling time—i.e., the sampling time ts and the target sampling time tt are the same.

In actuality, when the sending circuit 102 sends the data signals DQ and the clock signal CLK to the receiving circuit 104, the sampling circuitry of the receiving circuit 104 may not receive the clock pulses in their respective target sampling positions. For a given sampling circuit that samples data pulses of an input data signal in response to sampling transitions of a clock signal, where the sampling transitions occur at times different than the target sampling times tt, the input data signal and the clock signal have skew between them. In general, as used herein, skew between a clock signal and a data signal is a deviation of a sampling transition of the clock signal from a target sampling position to sample a data pulse of the data signal. In addition, with respect to sampling times, skew between a clock signal and a data signal is a deviation of a sampling time ts from a target sampling time tt to sample a data pulse of a data signal. For a given pair of clock and data signals, where the clock signal performs sampling transitions at sampling times ts that match or occur at the same times as the target sampling times tt, the clock and data signals do not have skew between them. Alternatively, where the clock signal performs sampling transitions at sampling times ts different than the target sampling times tt (i.e., before or after the target sampling times tt), the clock and data signals have skew between them. An amount of skew (or skew amount) may be quantified by the difference in time between the sampling time ts and the target sampling time tt.

Various manufacturing or environmental conditions may cause skew between clock and data signals, such as imperfections in the alignment and transmission of the clock and data signals by the sending circuit 102, differences in propagation delay in the lines of the communications bus 106, or process-voltage-temperature (PVT) fluctuations, as non-limiting examples. Not only do such manufacturing or environmental conditions displace sampling transitions of the clock signal CLK from their target sampling positions, but they may displace the sampling transitions by different amounts for sampling different data signals DQ. That is, for a plurality of sampling circuits that sample the plurality of input data signals DQ in response to sampling transitions of the clock signal CLK, some sampling circuits may receive sampling transitions of the clock signal CLK further away from the target sampling transitions than others. As operating frequencies continue to increase, differences in skew between the clock signal CLK and different data signals DQ may be more pronounced, requiring skew correction processes that can flexibly or independently correct for skew for multiple data signals DQ.

Figure 6:
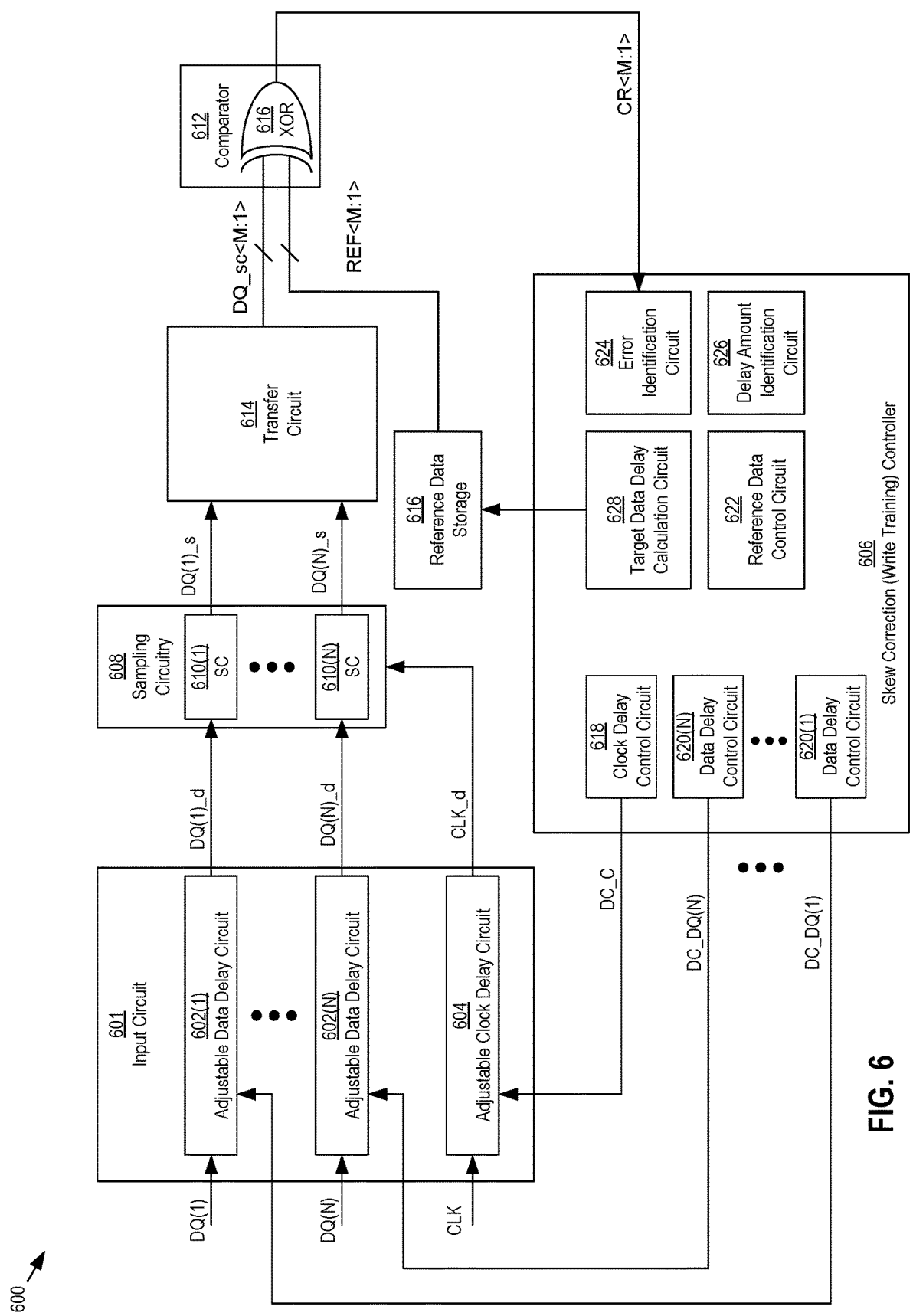
FIG. 6 is a block diagram of an example skew correction system.

FIG. 6 shows a block diagram of an example skew correction system 600 configured to perform skew correction processes. As used herein, a skew correction process is a process that reduces skew between a clock signal and a data signal. In addition or alternatively, a skew correction process is a process that moves sampling times of a clock signal closer to target sampling times to sample data pulses of a data signal.

The embodiments of the skew correction system 600 described herein correct for skew between the input clock signal CLK and the N-number of input data signals DQ during skew correction processes. During a skew correction process, the skew correction system 600 may correct for skew by first delaying the input clock signal CLK by a reference clock delay amount to generate a delayed clock signal CLK_d. Then, the skew correction system delays the input data signals DQ to determine target data delay amounts, relative to the reference clock delay amount, that position sampling transitions of the delayed clock signal CLK_d in target sampling positions.

Since different input data signals DQ may have different amounts of skew relative to the clock signal CLK, the skew correction system 600 may be configured to independently control or adjust the delay of at least two of the input data signals DQ. During delay of the input data signals DQ, the skew correction system 600 may identify first data delay amounts that identify upper bounds of data valid window $T_{DVW}$ and second data delay amounts that identify lower bounds of the data valid windows $T_{DVW}$. Through independent control of the delay, the skew correction system 600 may independently determine data valid windows $T_{DVW}$ for at least two different input data signals DQ, but determines each of the data valid windows $T_{DVW}$ with reference to the same reference clock delay amount—i.e., with the input clock signal CLK_delayed by the same reference clock delay amount. Upon identifying the first and second data delay amounts, and in turn the data valid windows $T_{DVW}$, the skew correction controller 600 identifies middle positions of the data valid window $T_{DVW}$ by averaging the first and second data delay amounts. The skew correction system 600 identifies the averages as the target data delay amounts that position the sampling transitions of the delayed clock signal CLK_d in target sampling positions when the input clock signal CLK is delayed by the reference clock delay amount.

In further detail with respect to FIG. 6, the skew correction system 600 includes an input circuit 601 that includes a plurality of adjustable delay circuits 602, 604. In general, a delay circuit is a circuit that delays an input signal by an amount of delay to generate and output a delayed signal.

Where the delay circuit receives and delays a clock signal, the delay circuit is referred to as a clock delay circuit. Where the delay circuit receives and delays a data signal, the delay circuit is referred to as a data delay circuit. Additionally, where the input signal is clock signal, the delayed signal is referred to as a delayed clock signal. Where the input signal is a data signal, the delayed signal is referred to as a delayed data signal.

The input signal that a delay circuit receives includes a sequence of pulses. For example, an input clock signal includes a sequence of clock pulses, and an input data signal includes a sequence of data pulses. Each pulse of the sequence of pulses has a relative temporal position in the sequence relative to the other pulses. Assuming that the sequence of pulses propagates over a given point of a conductive path, the relative temporal positions of the pulses indicates when the pulses propagate over the given point relative to when the other pulses propagate over the given point. The delayed signal that the delay circuit outputs also has a sequence of pulses, with each pulse having a relative temporal position in the sequence relative to the other pulses. A delay circuit includes an input terminal at which the delay circuit receives the input signal and an output terminal at which the delay circuit generates and outputs the delayed signal. In addition, the delay circuit is configured with a delay having an amount (referred to as a delay amount), which is the amount by which the delay circuit delays the input signal to generate the delayed signal at its output terminal. Accordingly, the delay circuit generates the delayed signal at its output terminal by delaying each of the pulses of the input signal by the delay amount. As a result, for each of the pulses of the delayed signal, a time at which the delay circuit generates and outputs a given pulse of the delayed signal at the output terminal occurs later in time, equal in duration to the delay amount, from the time that the delay circuit received the pulse of the input signal having the same temporal position in its sequence as the given pulse of the delayed signal.

In addition, an adjustable delay circuit is a delay circuit that can adjust the amount of its delay. In this context, the delay by which an adjustable delay circuit delays its input signal is adjustable, changeable, or variable in that the adjustable delay circuit can change, adjust, or vary the delay amount over a time period, and/or can set the delay to one amount at a first time, and can set the delay to a different amount at a second time. The change in delay may be an increased delay or a decrease in delay. Accordingly, an adjustable delay circuit delays an input signal at a given point in time by the amount of the delay of the delay circuit at that given point in time. In turn, the delayed signal that an adjustable delay circuit generates can have pulses that have varying amounts of delay with respect to the pulses of the input signal depending on the changes in the amount of delay of the delay circuit.

As shown in FIG. 6, the plurality of adjustable delay circuits includes an N-number of adjustable data delay circuit 602(1) to 602(N), each configured to delay a respective one of the N-number of input data signals DQ(1) to DQ(N), and an adjustable clock delay circuit 604 configured to delay the clock signal CLK. Where the clock signal CLK is a pair of complementary input clock signals CLK, CLKB, the adjustable clock delay circuit 604 may include a pair of adjustable clock delay circuits, each configured to delay a respective one of the pair of complementary input clock signals CLK, CLKB. For simplicity, in the example configuration shown in FIG. 6, the adjustable delay circuits includes a single adjustable clock delay circuit 604 configured to delay a single-ended input clock single CLK.

Additionally, each of the adjustable delay circuits 602, 604 is configured to delay a respective input signal CLK, DQ to generate a respective delayed signal. For example, a first adjustable data delay circuit 602(1) is configured to delay a first input data signal DQ(1) to generate a first delayed data signal DQ(1)_d, an Nth adjustable data delay circuit 602(N) is configured to delay an Nth input data signal DQ(N) to generate an Nth delayed data signal DQ(N)_d, and the adjustable clock delay circuit 604 is configured to delay the input clock signal CLK to generate a delayed clock signal CLK_d.

The skew correction system 600 may further include a skew correction controller 606 that controls skew correction processes. A skew controller is a component, or a module, designed, and built, to control skew correction processes. In certain embodiments, a skew correction controller may comprise hardware, firmware (or software), or a combination of hardware and firmware (or software). For example, a skew correction controller may include or be a component of an integrated circuit (IC), such as an application specific integrated circuit (ASIC) or a field programmable gate array (FPGA), a circuit, a digital logic circuit, an analog circuit, a combination of discrete circuits, gates, or any other type of hardware or combination thereof. In addition, or alternatively, a skew correction controller may include memory hardware that comprises instructions executable with a processor or processor circuitry to implement one or more of the features of the program controller. A skew correction controller, which may be an on-die skew correction controller in certain embodiments, can take the form of processing circuitry, a microprocessor or processor, and a computer-readable medium (e.g., a non-transitory computer readable storage medium) that stores computer-readable program code (e.g., software or firmware) executable by the (micro) processor, logic gates, switches, an application specific integrated circuit (ASIC), a programmable logic controller, and an embedded microcontroller.

In further detail with respect to FIG. 6, the skew correction controller 606 determines when to perform skew correction processes, including when to start a skew correction process, when to end a skew correction process, and when to transition between different delay phases of a skew correction process. For example, as described in further detail below, the skew correction controller 606 can control the delay of the adjustable clock delay circuit 604, including when to delay the adjustable clock delay circuit 604 (including when to start delaying the adjustable clock delay circuit 604 and when to stop delaying the adjustable clock delay circuit 604), how much to have the adjustable clock delay circuit 604 delay the clock signal CLK to generate the delayed clock signal CLK_d, including whether and/or how much to increase the clock delay amount or decrease the clock delay amount.

Similarly, the skew correction controller 606 can control the delay of the adjustable data delay circuits 602, including when to delay the adjustable data delay circuits 602 (including when to start delaying the adjustable data delay circuit 602 and when to stop delaying the adjustable data delay circuits 602), and how much to have the adjustable data delay circuits 602 delay their respective input data signals DQ to generate the delayed data signals DQ_d, including whether and/or how much to increase the data delay amounts or decrease the data delay amounts.

Additionally, the skew correction controller 606 is configured to control at least two of the adjustable data delay circuits 602 independent from each other. To implement the independent control, the N-number of adjustable data delay circuits 602 may be arranged into at least two groups. The skew correction controller 606 can independently control the delay amounts for the adjustable data delay circuits 602 in the different groups. In addition, the skew correction controller 606 may control adjustable data delay circuits 602 that are part of the same group the same way, i.e., without being able to independently control their respective delays.

In particular example embodiments, the skew correction controller 606 is configured to control the delays of each of the adjustable data delay circuits 602 independent of each other. For such example configurations, each adjustable data delay circuit 602 may be considered part of its own group—i.e., each group includes only one adjustable data delay circuit 602. For other example configurations, one or more groups may include two or more adjustable data delay circuits 602. At a minimum, the N-number of adjustable data delay circuits 602 may be arranged into two groups.

In addition, through its control of the adjustable data and clock delay circuits 602, 604, the skew correction controller 606 controls the delay amounts by which the input clock and data signals CLK, DQ are delayed. Accordingly, the skew correction controller 606 delays the input data signals DQ by way of the adjustable data delay circuits 602, and delays the input clock signal CLK by way of the adjustable clock delay circuit 604.

In addition, the delay controller 606 is configured to control the delay of the adjustable data and clock delay circuits 602, 604 through output of delay control signals DC to the adjustable delay circuits 602, 604. For example, the skew correction controller 606 is configured to output a first data delay control signal DC_DQ(1) to the first adjustable data delay circuit 602(1), an Nth data delay control signal DC_DQ(N) to the Nth adjustable data delay circuit 602(N), and a clock delay control signal DC_C to the adjustable clock delay circuit 604.

The delay control signals DC may be analog signals or digital signals, depending on the configuration of the adjustable data and clock delay circuits 602, 604. For configurations where the skew correction controller 606 outputs the delay control signals DC as analog signals, the skew correction controller 606 may set the levels or magnitudes, such as voltage levels or magnitudes, of the delay control signals DC in order to set the delays of the adjustable data and clock delay circuits 602, 604 to certain delay amounts. When the skew correction controller 606 wants to change a delay amount of one of the adjustable delay circuits 602, 604, the skew correction controller 606 changes or adjusts the level or magnitude.

For configurations where the skew correction controller 606 outputs the delay control signals DC as digital signals, the skew correction controller 606 may output the delay control signals DC as digital codes. Each digital code DC may represent a p-bit binary number, where p is the number of digits of the p-bit binary number, and where each digit can be a logic 0 value or a logic 1 value. In implementation, the skew correction controller 606 may output a delay control signal DC as a digital code as or in the form of a p-number of voltages in parallel, with each voltage being at a high voltage level to indicate a logic 1 value or a low voltage level to indicate a logic 0 value.

At a given moment in time at which a given adjustable delay circuit 602, 604 receives the voltages of the digital code, the combination of the voltages at their respective high and low voltage levels may indicate a current value of the p-bit binary number that the digital code represents. The given adjustable delay circuit 602, 604 may respond to the digital code by delaying its respective input data or clock signal DQ, CLK by a delay amount that corresponds to the current value of the p-bit number represented by the digital code. When the skew correction controller 606 wants to change the amount of the delay by which the given adjustable delay circuit 602, 604 is delaying its respective data or clock signal DQ, CLK, the skew correction controller 606 changes the digital value of the digital code, such as by changing one or more of the p-number of parallel voltages from a high level to a low level, or from a low level to a high level.

Figure 7:
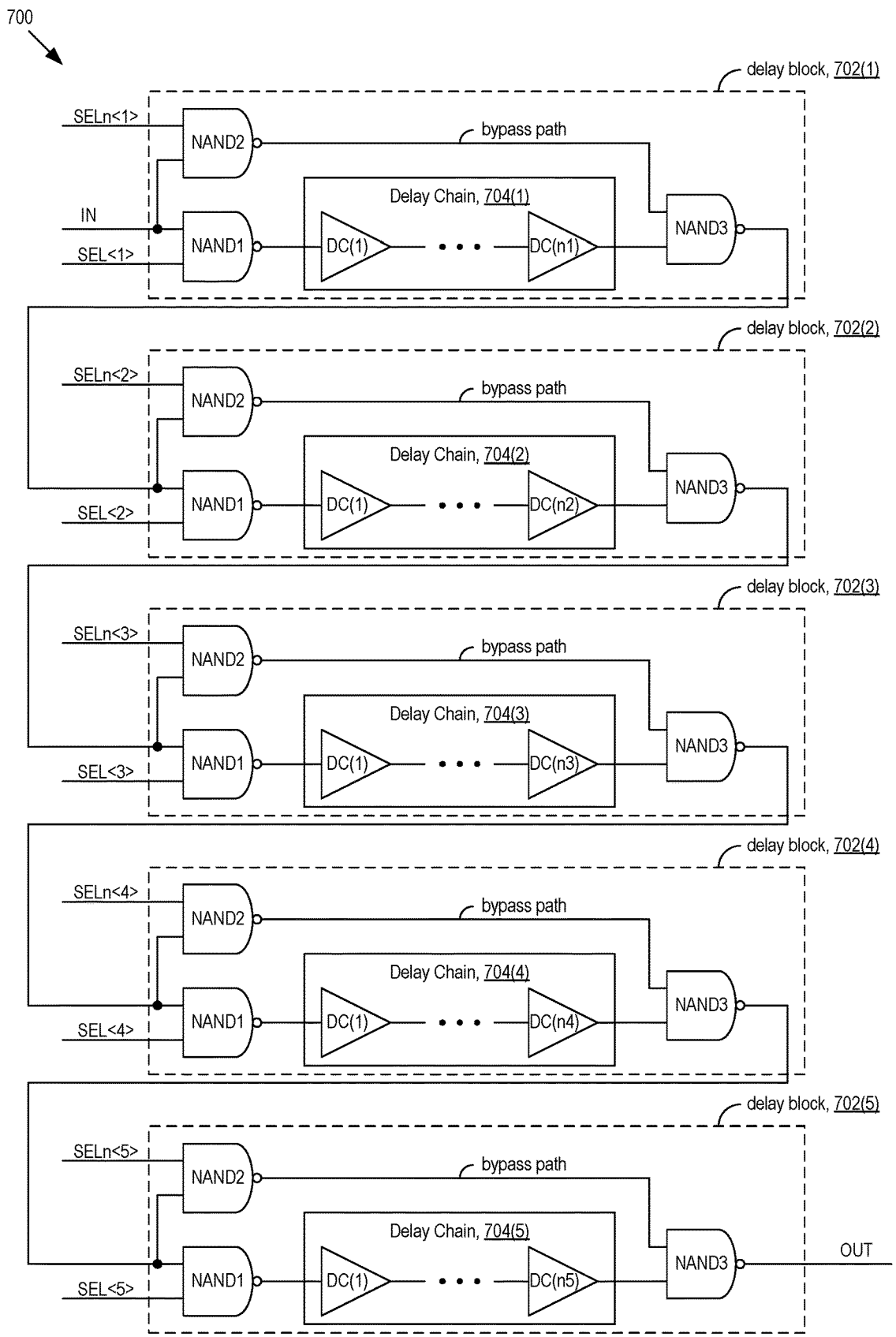
FIG. 7 is a block diagram of an example configuration of an adjustable delay circuit that may be used for adjustable clock and data delay circuits of the skew correction system of FIG. 6.

FIG. 7 shows a block diagram of an adjust example delay circuit 700 that may be used as the configuration for any of the adjustable delay circuits 602 or the clock delay circuit 604 of FIG. 6. As shown in FIG. 7, the adjustable delay circuit 700 may be configured to receive an input signal IN, and delay the input signal IN to generate an output signal OUT, which is a delayed version of the input signal IN.

The delay circuit includes a plurality of delay blocks 702. The example configuration shown in FIG. 7 includes 5 delay blocks 702(1) to 702(5), although numbers other than 5 may be used for other example configurations. The first block is configured to receive the input signal IN. The other blocks each have their respective input coupled to the output of a prior delay block 702 of the adjustable delay circuit 700.

An input signal that each of the blocks 702 receives is referred to as its local input signal. Except for the first delay block 702(1), each of the blocks 702 receives its local input signal from a prior delay block 702 of the adjustable delay circuit 700. Additionally, an output signal that each of the blocks 702 outputs is referred to as its local output signal. Except for the last, or fifth block 702(5), each of the blocks 702 may be configured to output a local output signal to a next block 702 of the delay circuit 700. Accordingly, the first delay block 702(1) outputs a local output signal to the second delay block 702(2), which the second delay block 702(2) receives as its local input signal, the second delay block 702(2) outputs a local output signal to the third delay block 702(3), which the second delay block 702(3) receives as its local input signal, and so on.

In addition, as shown in FIG. 7, each delay block 702 includes a respective delay chain 704 of delay cells DC. Each ith delay chain 704(i) includes an ni-number of delay cells, extending from a first delay cell DC(1) to a nith delay cell DC(ni). The numbers of delays DC among the delay chains 704 may the same or different from each other. In some example configurations, the number of delay cells DC increases as the delay blocks 702 are positioned further in the adjustable delay circuit 700. In particular example configurations, the numbers of delay cells increase by powers of two. For example, the first delay chain 704(1) may include two delay cells (n1=2), the second delay chain 704(2) may include four delay cells (n2=4), the third delay chain 704(3) may include eight delay cells (n3=8), the fourth delay chain 704(4) may include 16 delay cells (n4=16), and the fifth delay chain 704(5) may include 32 delay cells (n5=32). Varying the numbers of delay cells DC among the various delay chains may provide more a wider range of possible delay amounts by which to delay the input signal IN to generate the output signal OUT.

Additionally, each delay cell DC may provide a unit of delay, which may be measured in units of time, such as a number of nanoseconds or picoseconds, for example. Accordingly, the total amount of delay by which an ith delay chain 704(i) delays its local input signal is equal to the unit of delay of a delay cell DC multiplied by the number of delay cells ni in the ith delay chain 704(*i*). The more delay cells, the greater the amount of the delay by which an ith delay chain 704(*i*) delays its local input signal.

The adjustable delay circuit 700 adjusts the amount of delay by which it delays the input signal IN by adjusting which delay blocks 702 are involved in delaying the input signal IN. The adjustable delay circuit 700 provides the greatest delay when all of the delay blocks 702 are involved in delaying the input signal IN, and provides the lowest delay when none of the delay blocks 702 are involved in delaying the input signal IN.

As shown in FIG. 7, each delay block 702 includes a bypass path extending in parallel with a respective delay chain 704. When a bypass path of a given ith delay block 702(*i*) is enabled, the bypass path may communicate the local input signal past the corresponding ith delay chain 704(*i*), such that the ith delay chain 704(*i*), and in turn the ith delay block 702(*i*), is not involved with delaying the input signal IN to generate the output signal OUT. Alternatively, when a bypass path of a given ith delay block 702(*i*) is disabled, the ith delay chain 704(*i*) may receive and delay the local input signal, such that the ith delay chain 704(*i*), and in turn the ith delay block 702(*i*), is involved or participates in the delaying of the input signal IN to generate the output signal OUT.

To enable or disable the bypass paths, each delay block 702 includes a selection circuit, coupled to an associated delay chain and bypass path, that selectively enables or disables the bypass path. The skew correction controller 606 is configured to control the selection circuits to selectively enable or disable each of the bypass paths through output of a pair of complementary m-bit selection signals SEL<m:1>, SELn<m:1>. The number of bits m is equal to the number of delay blocks 702. The skew correction controller 606 is configured to output each ith pair of complementary bits SEL<i>, SELn<i> to a respective selection circuit of an ith block.

In the example configuration shown in FIG. 7, each selection circuit includes three NAND gates, including a first NAND gate NAND1, a second NAND gate NAND2, and a third NAND gate NAND3. For a given ith block 702(*i*), the first and second NAND gates NAND1, NAND2 each include a first input configured to receive a respective local input signal, and a second input terminal configured to receive a bit from an ith pair of complementary bits SEL<i>, SELn<i>. For example, in the configuration shown in FIG. 7, the first NAND gate NAND1 receives the ith selection signal SEL<i>, and the second NAND gate NAND2 receives the ith complementary selection signal SELn<i>. In accordance with the complementary configuration, an ith pair of complementary selections signals SEL<i>, SELn<i> have opposite logic 1 and logic 0 values. Additionally, the first NAND gate NAND1, which has its second input configured to receive the ith selection signal SEL<i>, has its output coupled to the input of the ith delay chain 704(*i*). The second NAND gate NAND2, which has its second input configured to receive the ith complementary selection signal SELn<i>, has its output coupled to the bypass path. The third NAND gate NAND3 includes a first input coupled to the output of the ith delay chain 704(*i*), a second input coupled to the bypass path, and an output that functions as the output of the ith delay block 702(*i*).

When the skew correction controller 606 wants an ith delay block 702(*i*), and/or its ith delay chain 704(*i*) to be involved in the delay of the input signal IN, the skew correction controller 606 may output the ith selection signal SEL<i> at a high or logic 1 level, and may output the ith complementary selection signal SELn<i> at a low or logic 0 level, which in turn disables the bypass path. In turn, the third NAND gate NAND3 generates the local output signal of the ith delay block 702(*i*) in response to the output of the ith delay chain 704(*i*). Alternatively, when the skew correction controller 606 wants an ith delay block 702(*i*), and/or its ith delay chain 704(*i*) to be uninvolved or not participate in the delay of the input signal IN, the skew correction controller 606 may output the ith selection signal SEL<i> at the low or logic 0 level and the ith complementary selection signal SELn<i> at the high or logic 1 level, which in turn enables the bypass path. In turn, the third NAND gate NAND3 generates the local output signal of the ith delay block 702(*i*) in response to the signal communicated on the bypass path.

During a skew correction process, the skew correction controller 606 may determine an amount of delay to set for a given adjustable delay circuit (i.e., one of the adjustable data delay circuits 602 or the adjustable clock circuit 604). In turn, the skew correction controller 606 may determine an m-bit pair of complementary selection signals SEL, SELn that causes a certain combination of the delay blocks 702 to be involved or participate in the delay of the given input signal (e.g., one of the input signals DQ or the clock signal CLK) so that the given adjustable delay circuit delays the given input signal by the determined amount of delay. When the skew correction controller 606 determines to adjust the amount of delay, the skew correction controller 606 determines how to change the m-bit pair of complementary selection signals SEL, SELn to effect the change in the amount of delay.

Referring back to FIG. 6, the skew correction system 600 further includes (or is in communication with) sampling circuitry 608 that is configured to sample data pulses of the N-number of delayed data signals DQ(1)_d to DQ(N)_d output from the N-number of adjustable data delay circuits 602(1) to 602(N) in response to sampling transitions of the delayed clock signal CLK_d. That is, the sampling circuitry 608 samples the delayed data signals DQ_d in response to the sampling transitions of the delayed clock signal CLK_d, instead of sampling the input data signals DQ in response to the input clock signal CLK.

The sampling circuitry 608 may include an N-number of sampling circuits (SC) 610(1) to 610(N), such as in the form of flip flops or latches, each configured to sample data pulses a respective one of the N-number of delayed data signals DQ(1)_d to DQ(N)_d in response detection of sampling transitions of the delayed clock signal CKL_d. In addition, each of the sampling circuits 610(1) to 610(N) may be configured to output a respective one of an N-number of sampled data signal DQ(1)_s to DQ(N)_s at levels indicative of the levels of the respective delayed data signals DQ(1)_d to DQ(N)_d it sampled.

The skew correction system 600 may further include a comparator circuit 612 that is configured to identify sampling errors made by the sampling circuitry 608. The comparator circuit 612 may identify the sampling errors by comparing a combined sampled data signal DQ_sc with a reference data signal REF. The combined sampled data signal DQ_sc is a combination of at least some of the sampled data pulses of the sampled data signals DQ(1)_s to DQ(N)_s. In some example configurations, the combined sampled data signal DQ_sc includes an M-number of data pulses, each corresponding to one of the data pulses of one of the sampled data signals DQ(1)_s to DQ(N)_s. In addition or alternatively, the combined sampled data signal DQ_sc may be considered an M-bit digital signal, with each bit of the M-number of bits represented by one of the M-number of pulses. In some example configurations, the M-number of pulses are communicated on an M-number of parallel data lines.

In particular example configurations, the M-number of bits is equal to the N-number of sampling circuits 610 multiplied by the number of sampling actions each of the sampling circuits 610 performed over a given time period during which each sampling circuit 610 performs a P-number of sampling actions. That is, over a given period of time, each sampling circuit 610 samples a respective delayed data signal DQ_d P times. Accordingly, the number of bits M is equal to the total number of sampling actions that the sampling circuitry 808 performs over the given time period.

To illustrate, suppose the sampling circuitry 608 includes 8 sampling circuits 610(1) to 610(8) (N=8), and over a given period of time, each sampling circuit 610 samples its respective delayed data signals DQ_d 8 times (P=8). Accordingly, M is 64—i.e., the sampling circuitry 608 performed 64 sampling actions over the given time period, and the combined sampled signal DQ_sc<64:1> that the comparator circuit 612 receives to identify the sampling errors is a 64-bit digital signal.

The skew correction system 600 may include (or be in communication with) a transfer circuit 614 that is configured to transfer the sampled data signals DQ_s to the comparator circuit 612. The transfer circuit 614 may be configured to convert the sampled data signals DQ_s output from the N-number of sampling circuits 610 to the combined sampled data signal DQ_sc. The transfer circuit 614 may include any of various combinations of multiplexer circuitry (MUX), parallel-in, serial-out circuitry (PISO), and serial-in, parallel-out (SIPO) to convert the data pulses of the N-number of sampled data signals DQ(1)_s to DQ(N)_s to the combined sampled data signal DQ_sc.

The reference data signal REF includes data pulses that indicate logic or data values of a reference bit sequence. The data values that the N-number of data signals DQ(1) to DQ(N) carry may form a bit sequence that matches the reference bit sequence. The combined sampled signal DQ_sc also carries a bit sequence indicated by the levels of the data pulses of the combined sampled signal DQ_sc. The bit sequence carried by the combined sampled signal DQ_sc is referred to as a sampled bit sequence.

The skew correction circuit 600 may further include (or be in communication with) a reference data storage 616 that stores data bits comprising the reference bit sequence. The reference data storage 616 may include volatile memory, non-volatile memory, or a combination thereof. The skew correction controller 606 may be control the generation of the reference data signal REF based on the data bits stored in the reference data storage 616. For example, the skew correction controller 606 may execute a read operation on the reference data storage 616, and the data that is read out from the reference data storage 616 in response to the read operation is in the form of the reference data signal REF that is transferred from the reference data storage 616 to the comparator circuit 612. In some example configurations, circuit components of the transfer circuit 614 are used to convert the reference data signal REF into an M-bit format that can be compared with the combined sampled data signal DQ_sc.

As mentioned, the comparator circuit 612 is configured to compare the combined sampled signal DQ_sc with the reference data signal REF to identify sampling errors. For configurations where the combined sampled data signal DQ_s is in the form of an M-bit signal, the reference signal REF may also be in the form of an M-bit signal. To identify the sampling errors, the comparator circuit 612 is configured to compare each sampled data pulse of the combined sampled signal DQ_sc with a corresponding pulse of the reference signal REF. If the levels of two pulses being compared match, then the comparator circuit 612 determines that whichever sampling circuit 610 produced that sampled data pulse did not make a sampling errors. On the other hand, if the levels of the two pulses being compared do not match, then the comparator circuit 612 determines that whichever sampling circuit produced that sampled data pulse made a sampling error.

Accordingly, if the sampling circuits 610 do not perform any sampling errors when sampling the delayed data signals DQ_d, then the M-bit sampled bit sequence indicated by the data pulses of the combined sampled data signal DQ_sc matches the M-bit reference bit sequence indicated by the data pulses of the reference data signal REF. On the other hand, if the sampling circuits 610 perform at least one sampling error, then the M-bit sampled bit sequence will not match the M-bit reference bit sequence. Instead, at least one bit between the M-bit sampled bit sequence and the M-bit reference bit sequence will be different. The number of bits that are different and which bits of the M-bit sequences are different from each other will depend on which of the sampling circuits 610(1) to 610(N) performed the sampling error(s) and how many sampling errors each of the sampling circuits 610(1) to 610(N) made.

The comparator circuit 612 is configured to output a comparison result signal CR to the skew correction controller 606 that identifies sampling errors performed by the sampling circuits 610. In particular example configurations, the comparison result signal CR is in the form of an M-bit digital signal indicating an M-number of sampling results. As used herein, a sampling result is a result of a sampling action performed by a sampling circuit. A sampling result may be one of two types, either a sampling error or a sampling pass. As previously described, a sampling error is a result that a sampling circuit produces, generates, makes, or outputs in response to incorrectly sampling a level of an input data signal. A sampling pass is a result that a sampling circuit produces, generates, makes, or outputs in response to correctly sampling a level of an input data signal.

With respect to the M-bit comparison result signal CR<M:1>, each bit indicates a sampling result of an M-number of sampling actions—whether the sampling circuitry 608 performed a sampling pass or a sampling error when sampling a data pulse of a delayed data signal DQ_d corresponding to that bit. To generate the comparison result signal CR as an M-bit signal, the comparator circuit 612, may perform an M-number of comparisons for each of an M-number of pairs of corresponding data pulses between the combined sampled data signal DQ_sc<M:1> and the reference data signal REF<M:1>.

In some example configurations, the comparator 610 may include an XOR logic gate circuit 616 to identify the sampling errors. In particular, the XOR logic gate circuit 616 may compare the data pulses of the combined sampled signal DQ_sc with corresponding data pulses of the reference signal REF. For a given data pulse of the combined sampled signal DQ_sc and a corresponding data pulse of the reference data signal REF, if the two data pulses have the same or matching levels (they are both at the high level or both at the low level), then the XOR logic circuitry 616 outputs the comparison result signal CR at a logic low level indicating that the levels of the corresponding data pulses match. Alternatively, if the two corresponding data pulses have different levels (one is at the high level and the other is at the low level), then the XOR logic gate circuit 616 outputs the comparison signal CR at a logic high level indicating that the levels of the corresponding data pulses are different (i.e., they do not match).

In order to perform a skew correction process, the skew correction controller 606 may analyze a sampling analysis of a plurality of sampling actions performed by the sampling circuitry 608 to determine how to delay the adjustable delay circuits 602, 604. In general, a sampling analysis is a data structure, such as a table, a graph, a chart, a list, or a report, or a signal, such as an analog signal or a digital signal, that identifies or conveys sampling results for a plurality or predetermined number of sampling actions. A sampling analysis may identify a number of sampling actions performed, and a sampling result for each of the sampling actions. For example, a sampling analysis may identify whether each sampling action resulted in a sampling pass or a sampling error. In addition, for configurations where a sampling analysis is generated for a plurality of sampling circuits that performed the sampling actions, the sampling analysis may identify which of the sampling circuits performed which of the sampling actions. In turn, the sampling analysis identifies which of the sampling circuits produced which of the sampling results identified in the sampling analysis. Accordingly, from a sampling analysis, the skew correction controller 606 can identify a total number of sampling errors resulting from the sampling actions, and a number of sampling errors produced from each of the sampling circuits 610 performing the sampling actions.

In the example configuration shown in FIG. 6, the skew correction controller 606 may receive a sampling analysis in the form of the M-bit comparison result signal CR<M:1>. As previously described, the M-number of bits of the comparison result signal CR may indicate an M-number of sampling actions and sampling results of the those sampling actions. In response to receipt of the M-bit comparison result signal CR<M:1>, the skew correction controller 606 may identify a total number of sampling errors indicated by the comparison result signal CR<M:1> and a number of sampling errors performed by each of the sampling circuits 610.

Figure 8:
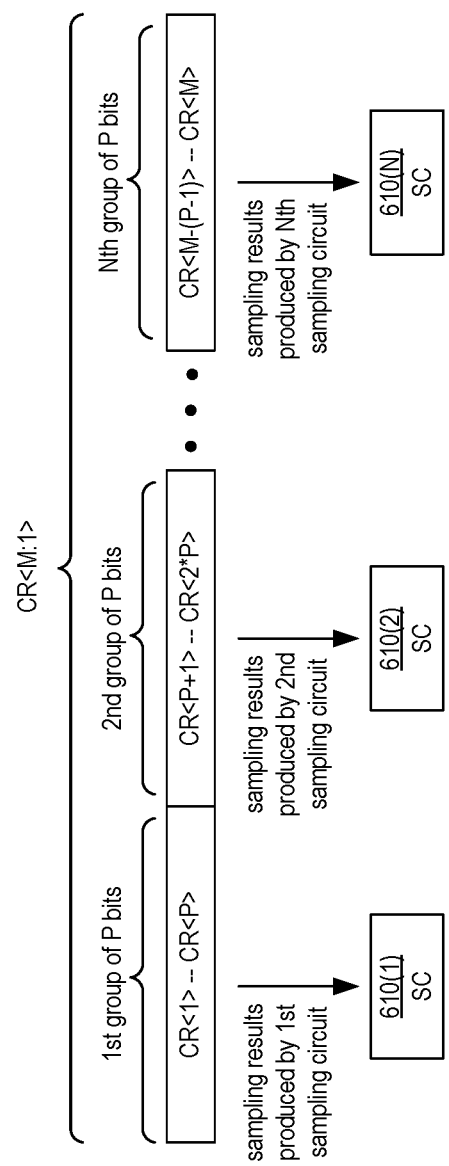
FIG. 8 is a schematic diagram of an example comparison result signal indicating sample results.

FIG. 8 is a schematic diagram of an example M-bit comparison result signal CR<M:1> indicating sample results. As shown in FIG. 8, the comparison result signal CR is separated into an N-number of groups of bits, with each bit group including a P-number of bits. Each bit group may correspond to one of the N-number of sampling circuits 610, in that the bit values of a specific bit group identify the sampling results of a specific one of the sampling circuits 610. For example, a first group of P bits, including bits CR<1> to CR<P> indicates sample results of sampling actions performed by the first sampling circuit 610(1); a second group of P bits CR<P+1> to CR<2*P> indicates sample results of sampling actions performed by the second sampling circuit 610(2); and an Nth group of P bits, including CR<M−(P−1)> to CR<M> indicates sample results of sampling actions performed by the Nth sampling circuit 610(N). From the M-bit comparison result signal CR<M:1>, the skew correction controller 606 can identify a total number of sampling errors from the M-number of sampling actions performed by the sampling circuits 610, which sampling circuits 610 are responsible for making the sampling errors, and how many sampling errors each sampling circuits 610 made.

Referring back to FIG. 6, the skew correction controller 606 performs a skew correction process by identifying numbers of sampling errors indicated by M-bit comparison result signals CR. The skew correction controller 600 performs a skew correction process over several iterations. In each iteration, the adjustable data delay circuits 602 receive an M-number of data pulses of the input data signals, and delay the M-number of data pulses to generate an M-number of data pulses of the delayed data signals DQ_d. The sampling circuitry 608 performs an M-number of sampling actions to sample the delayed data signals DQ_d in response to sampling transitions of the delayed clock signal CLK_d in order to generate sampled data signals DQ_s. The transfer circuit 614 converts the sampled data signals DQ_s into an M-bit combined sampled data signal DQ_sc<M:1>, and the comparator circuit 612 compares the combined sampled data signal DQ_sc<M:1> with the reference signal REF<M:1>, to generate the M-bit comparison result signal CR<M:1>. Lastly, the skew correction controller 606 analyzes the M-bit comparison result signal CR<M:1> to identify the number of sampling errors resulting from the M-number of sampling actions, which sampling circuits 610 made the sampling errors, how many sampling errors each sampling circuit 610 made for the M-number of sampling actions, or a combination thereof. Based on the analysis, the skew correction controller 606 determines how to delay the adjustable delay circuits 602, 604 for a next iteration. The skew correction controller 606 may proceed in this manner over several iterations until it performs a last iteration, at which point the skew correction controller 606 identifies target delay amounts to delay the adjustable data delay circuits 602. As previously described, the target delay amounts position the sampling positions of the delayed clock signal CLK_d in target sampling positions with the adjustable clock delay circuit 604 set to the reference clock delay amount.

The skew correction controller 606 may perform the iterations over a plurality of phases, including a clock delay phase and a data delay phase. During the clock delay phase, the skew correction controller 606 controls the clock delay circuit 604 to delay the input clock signal CLK until a clock delay of the adjustable clock delay circuit 604 reaches a reference clock delay amount that creates a first threshold number of sampling errors. The skew correction controller 606 may control the clock delay circuit 604 by increasing, such as incrementally increasing, the clock delay amount of the clock delay circuit 604 during each next iteration. In addition, the skew correction controller 606 may keep the delay amounts of the adjustable data delay circuits 602 fixed during the clock delay phase.

In addition, during a given iteration of the clock delay phase, the skew correction controller 606 may identify that the first threshold number of sampling errors has been reached by analyzing a sampling analysis, such as in the form of the M-bit comparison result signal CR<M:1> generated during the given iteration. When the skew correction controller 606 identifies that the first threshold number of sampling errors has been reached, the skew correction controller 606 identifies a current clock delay amount that produced or created the first threshold number of sampling errors, and records or identifies that current clock delay amount as the reference clock delay amount. Upon identifying the reference clock delay amount, the skew correction controller 606 may transition to the data delay phase of the skew correction process.

The first threshold number of sampling errors is a predetermined number that the skew correction controller 606 is configured to know or identify in order to know how much to delay the adjustable clock delay circuit 604 during the clock delay phase. As long as an identified number of sampling errors is below the first threshold number, the skew correction controller 606 may continue to increase the clock delay amount for a next iteration of the clock delay phase.

For some example configurations, the first threshold number of sampling errors may be a total number of sampling errors identified by an M-bit comparison result signal CR during a single iteration or by a plurality of M-bit comparison result signals CR over a plurality of iterations. For other example configurations, the first threshold number of sampling errors includes a plurality of first threshold numbers of sampling errors, where each of the plurality of first threshold numbers corresponds to one of the N-number of sampling circuits 610(1) to 610(N). For example, the first threshold number may be a number of sampling errors that at least two of the sampling circuits 610 is to make during a given M-number of sampling actions. The skew correction controller 606 may be configured to delay the adjustable clock delay circuit 604 until a last of the at least two sampling circuits makes the first threshold number of sampling errors. For some example configurations, the at least two sampling circuits 610 includes all or each of the sampling circuits 610. Additionally, for at least some example configurations, the first threshold number of sampling errors that each of the at least two sampling circuits 610 makes is 1. If fewer than the at least two sampling circuits 610 makes fewer sampling errors than the first threshold number, then the skew correction controller 606 continues to increase the clock delay amount of the adjustable clock delay circuit 604.

The number of sampling errors reaching the first threshold number may indicate that a threshold number of sampling circuits 610 are performing sampling actions with hold violations. That is, during the clock delay phase, the skew correction controller 606 may delay the adjustable clock delay circuit 604 to the point that data pulses of a threshold number of the delayed data signals DQ_d are not stable for the minimum amount of time after the sampling transitions of the delayed clock signals CLK_d are occurring, resulting in a threshold number of sampling circuits 620 making sampling errors. In this context, the first threshold number may identify or indicate a threshold of hold violations. That is, during the clock delay phase, the skew correction controller 606 identifies that a first threshold number of hold violations have occurred through identification of the first threshold number of sampling errors. Accordingly, the data delay phase starts with the adjustable clock delay circuit 604 delayed to a reference delay amount that causes or forces a threshold number of the sampling circuits 610 to make sampling errors.

During the data delay phase, the skew correction controller 606 is configured to identify target data delay amounts for the adjustable data delay circuits 602 relative to the reference clock delay amount—i.e., with the adjustable clock delay circuit 604 set to, fixed to, or maintained at the reference clock delay amount. To identify the target data delay amounts, the skew correction controller 606 controls the adjustable data delay circuits 602 to delay the input data signals DQ to identify first data delay amounts that produce a second threshold number of sampling errors. The skew correction controller 606 may control the adjustable data delay circuits 602 by increasing, such as incrementally increasing, the data delay amounts of the data delay circuits 602 during each next iteration. Upon identifying the second threshold number, the skew correction controller 606 identifies current data delay amounts for the adjustable data delay circuits 602, and records the current data delay amounts as the first data delay amounts for the adjustable data delay circuits 602. In addition, upon identifying the first data delay amounts, the skew correction controller 606 may continue to control the adjustable data delay circuits 602 to delay the input data signals DQ, such as by further increasing the delay amounts, until identifying second data delay amounts that produce a third threshold number of sampling errors. Upon identifying the third threshold number, the skew correction controller 606 identifies current data delay amounts for the adjustable data delay circuits 602, and records the current data delay amounts as the second data delay amounts for the adjustable data delay circuits 602. In addition, upon identifying the second data delay amounts, the skew correction controller 606 determines average delay amounts of the first and second data delay amounts. The skew correction controller 606 may identify the average delay amounts as the target data delay amounts for the adjustable data delay circuits 602.

In further detail, the second threshold number of sampling errors is a predetermined number that the skew correction controller 606 is configured to know or identify in order to identify one or more first data delay amounts for the adjustable data delay circuits 602. A first data delay amount is an upper bound of a data valid window $T_{DVW}$ for a sampling circuit. In addition or alternatively, with respect to a skew correction process described herein, a first data delay amount is a minimum delay amount for a given adjustable delay circuit 602 to have in order for a sampling circuit 610 to sample a delayed data signal from the given adjustable delay circuit 602 without hold violations. In addition or alternatively, a first data delay amount is a first delay value of a pair of delay values used to calculate a target data delay amount, such as an average delay amount, for one or more adjustable data delay circuits.

The second threshold number is generally lower than the first threshold number. During the clock delay phase, the skew correction controller 606 increases the delay of the adjustable clock delay circuit 604 until the sampling circuits 610 create a first threshold number of sampling errors. Then, to start the data delay phase, skew correction controller 606 begins increasing the data delay of at least one of the adjustable data delay circuits 602 to reduce the number of sampling errors from the first threshold number down to the second threshold number. As long as the number of sampling errors identified in an M-bit comparison result signal CR<M:1> is above the second threshold number, the skew correction controller 606 continues to increase the data delay of at least one of the adjustable data delay circuits 602.

As previously described, the first threshold number sampling errors may indicate a first threshold number of hold violations. Similarly, the second threshold number of sampling errors may indicate a second threshold number of hold violations. That is, during the clock delay phase, the skew correction controller 606 increases the clock delay until identifying that a first threshold number of hold violations through identification of the first threshold number of sampling errors. Then, during the data delay phase, the skew correction controller 606 increases the data delays until identifying that the hold violations has been reduced to a second threshold number through identification of the second threshold number of sampling errors.

For some example configurations, the second threshold number of sampling errors is a total number of sampling errors identified by an M-bit comparison result signal CR during a single iteration, or by a plurality of M-bit comparison result signals CR over a plurality of iterations. For other example configurations, the second threshold number of sampling errors includes a plurality of second threshold numbers of sampling errors, where each of the plurality of second threshold numbers corresponds to one of the N-number of sampling circuits 610(1) to 610(N) and/or to one of the N-number of adjustable data delay circuits 602(1) to 602(N).

In various embodiments, how the second threshold number is set or what it is configured to be, and how many first data delay amounts are determined, may depend on how the skew correction controller 606 is configured to control the data delays of the adjustable data delay circuits 602. In particular, the number of first data delay amounts that the skew correction controller 606 determines is equal to the number of adjustable data delay circuits 602 over which the skew correction controller 606 has independent control.

As an example, suppose the skew correction controller 606 is configured to independently control the delay of two groups of adjustable data delay circuits 602. The skew correction controller 606 is configured to independently control the delay for adjustable data delay circuits 606 in different groups, and does not have independent control over adjustable data delay circuits 602 that are part of the same group. Accordingly, during a given iteration while increasing the delay of the first group of adjustable data delay circuits 602, the skew correction controller 606 may identify that sampling errors produced from a first group of sampling circuits 610 has reached the second threshold number, where the first group of sampling circuits sample delayed data signals DQ_d from the first group of adjustable data delay circuits 602. In response, the skew correction controller 606 may identify a current data delay amount for the first group of adjustable data delay circuits 602 as the first data delay amount for the first group. Similarly, during a given iteration while increasing the delay of the second group of adjustable data delay circuits 602, the skew correction controller 606 may identify that sampling errors produced from a second group of sampling circuits 610 that sample delayed data signals DQ_d from the second group of adjustable data delay circuits 602 has reached the second threshold number. In response, the skew correction controller 606 may identify a current data delay amount for the second group of adjustable data delay circuits 602 as the first data delay amount for the second group.

In particular example configurations where the skew correction controller 606 is configured to independently control each of the N-number of adjustable data delay circuits 602, the skew correction controller 606 may identify an N-number of first data delay amounts, each for one of the N-number of adjustable data delay circuits 602. For example, the skew correction controller 606 may identify that sampling errors produced from a given ith sampling circuit 610(*i*) has reached the second threshold number, where the ith sampling circuit 610(*i*) samples an ith delayed data signal DQ(*i*)_d from an ith adjustable data delay circuit 602(*i*). In response, the skew correction controller 606 may identify a current data delay amount for the ith adjustable data delay circuit 602(*i*) as the first data delay amount for the ith adjustable data delay circuit 602(*i*). The skew correction controller 606 may identify first data delay amounts in this manner for each of the N-number of adjustable data delay circuits 602(1) to 602(N).

Additionally, in particular example configurations, the second threshold number of sampling errors is zero. That is, the skew correction controller 606 may identify the first data delay amount as the delay amount for an adjustable data delay circuit 602 that generates zero sampling errors with the adjustable clock delay circuit 604 set to the reference clock delay amount. Numbers other than zero for the second threshold number may be possible.

Upon identifying the first data delay amounts, the skew correction controller 606 is configured to continue to increase the delay of the adjustable data delay circuits 604 until identifying a third threshold number of sampling errors. The third threshold number of sampling errors is a predetermined number that the skew correction controller 606 is configured to know or identify in order to identify second data delay amounts for the adjustable data delay circuits 602. A second data delay amount is a lower bound of a data valid window $T_{DVW}$ for a sampling circuit. In addition or alternatively, with respect to a skew correction process described herein, a second data delay amount is a minimum delay amount for a given adjustable delay circuit 602 to have in order for a sampling circuit 610 to sample a delayed data signal from the given adjustable delay circuit 602 with setup violations. In addition or alternatively, a second data delay amount is a second delay value of a pair of delay values used to calculate a target data delay amount, such as an average delay amount, for one or more adjustable data delay circuits.

The third threshold number is generally higher than the second threshold number. During the data delay phase, upon identifying first data delay amounts for the adjustable data delay circuits 602, the skew correction controller 606 continues to increase the delay of the adjustable data delay circuits until the sampling circuits 610 increases the number of sampling errors from the second threshold number to the third threshold number. As long as the number of sampling errors identified in an M-bit comparison result signal CR<M:1> is below the third threshold number, the skew correction controller 606 continues to increase the data delay of at least one of the adjustable data delay circuits 602.

As previously described, the first threshold number sampling errors may indicate a first threshold number of hold violations, and the second threshold number of sampling errors may indicate a second threshold number of hold violations. In a similar manner, the third threshold number of sampling errors may indicate a threshold number of setup violations. That is, during the data delay phase, upon identifying the first data delay amounts, the skew correction controller 606 continues to increase the data delays until identifying that a threshold number of setup violations have been created through identification of the third threshold number of sampling errors.

Additionally, similar to the second threshold number, for some example configurations, the third threshold number of sampling errors is a total number of sampling errors identified by an M-bit comparison result signal CR during a single iteration, or by a plurality of M-bit comparison result signals CR over a plurality of iterations. For other example configurations, the third threshold number of sampling errors includes a plurality of third threshold numbers of sampling errors, where each of the plurality of third threshold numbers corresponds to one of the N-number of sampling circuits 610(1) to 610(N) and/or to one of the N-number of adjustable data delay circuits 602(1) to 602(N).

Also, similar to the second threshold number, in various embodiments, how the third threshold number is set or what it is configured to be, and how many second data delay amounts are determined, may depend on how the skew correction controller 606 is configured to control the data delays of the adjustable data delay circuits 602. In particular, the number of second data delay amounts is equal to the number of adjustable data delay circuits 602 over which the skew correction controller 606 has independent control.

As an example, suppose the skew correction controller 606 is configured to independently control the delay of two groups of adjustable data delay circuits 602. The skew correction controller 606 is configured to independently control the delay for adjustable data delay circuits 606 in different groups, and does not have independent control over adjustable data delay circuits 602 that are part of the same group. Accordingly, during a given iteration while increasing the delay of the first group of adjustable data delay circuits 602, the skew correction controller 606 may identify that sampling errors produced from a first group of sampling circuits 610 has reached the third threshold number, where the first group of sampling circuits sample delayed data signals DQ_d from the first group of adjustable data delay circuits 602. In response, the skew correction controller 606 may identify a current data delay amount for the first group of adjustable data delay circuits 602 as the second data delay amount for the first group. Similarly, during a given iteration while increasing the delay of the second group of adjustable data delay circuits 602, the skew correction controller 606 may identify that sampling errors produced from a second group of sampling circuits 610 that sample delayed data signals DQ_d from the second group of adjustable data delay circuits 602 has reached the third threshold number. In response, the skew correction controller 606 may identify a current data delay amount for the second group of adjustable data delay circuits 602 as the second data delay amount for the second group.

For certain example configurations where the skew correction controller 606 is configured to independently control each of the N-number of adjustable data delay circuits 602, the skew correction controller 606 may identify an N-number of second data delay amounts, each for one of the N-number of adjustable data delay circuits 602. For example, the skew correction controller 606 may identify that sampling errors produced from a given ith sampling circuit 610(i) has reached the third threshold number, where the ith sampling circuit 610(i) samples an ith delayed data signal DQ(i) d from an ith adjustable data delay circuit 602(i). In response, the skew correction controller 606 may identify a current data delay amount for the ith adjustable data delay circuit 602(i) as the second data delay amount for the ith adjustable data delay circuit 602(i). The skew correction controller 606 may identify second data delay amounts in this manner for each of the N-number of adjustable data delay circuits 602(1) to 602(N).

Additionally, in particular example configurations, the third threshold number of sampling errors is one. That is, the skew correction controller 606 may identify the second data delay amount as the delay amount for an adjustable data delay circuit 602 that generates one sampling error with the adjustable clock delay circuit 604 set to the reference clock delay amount. Numbers other than (e.g., greater than) one for the third threshold number may be possible.

In addition, for at least some example configurations, the skew correction controller 606 is configured to identify a second data delay amount as being at least one delay increment lower than the current delay amount that produced the third threshold number of sampling errors. Since the third threshold number of sampling errors may correspond to the minimum delay amount to cause a sampling circuit to sample a delayed data signal DQ_d with a setup violation, then one delay increment less may correspond to the lower bound of the data valid window $T_{DVW}$. Accordingly, for such example configurations, when the skew correction controller 606 identifies, in a given iteration, that the number of sampling errors has reached the third threshold number, the skew correction controller 606 may identify the current data delay amount that created the third threshold number of errors, and set the second data delay amount to one delay increment less than the current data delay amount. In general, in the example skew correction processes described herein, the skew correction controller 606 is configured to identify that a number of sampling errors has reached the third threshold number, and in response identify a second data delay amount as being a current data delay amount that produced the third threshold number of sampling errors, or a delay amount that is at least one increment away from (such as fewer than) the current data delay amount.

Upon identifying the one or more first data delay amounts and the one or more second data delay amounts, the skew correction controller 606 may identify one or more target data delay amounts. In particular example configurations, the skew correction controller 606 may determine the target data delay amounts by averaging the first and second data delay amounts. How the skew correction controller 606 determines the target data delay amounts may depend on how the skew correction controller 606 is configured to control the data delays of the adjustable data delay circuits 602, and/or how many first data delay amounts and how many second data delay amounts the skew correction controller 606 determines while delaying the adjustable data delay circuits 602. In general, the skew correction controller 606 is configured to determine a target data delay amount for each of the different groups based on respective first and second data delay amounts that the skew correction controller 606 determined for each of the particular groups.

For example, in the prior example illustrations where the skew correction controller 606 is configured to independently control two groups of adjustable data delay circuits 602, the skew correction controller 606 determines a first target data delay amount based on the first and second data delay amounts that it determined for the first group, and determines a second target data delay amount based on the first and second data delay amounts that it determined for the second group. In addition, for example configurations where the skew correction controller 606 is configured to control the adjustable data delay circuits 602 independently of each other, the skew correction controller 606 is configured to determine an N-number of target data delay amounts, each for a respective one of the N-number of adjustable data delay circuits 602. For example, the skew correction controller 606 determines an ith target data delay amount based on first and second data delay amounts that it determined for an ith adjustable data delay circuit 602(i). The skew correction controller 606 may determine target delay amounts in this manner for each of the N-number of adjustable data delay circuits 602(1) to 602(N).

In addition, for some example configurations as previously described, the target data delay amounts may be average delay amounts. That is, the skew correction controller 606 may be configured to determine an average data delay amount of a given pair of a first data delay amount and a second data delay amount, and identify the average as the target delay amount. The average data delay amount may represent a middle position of a data valid window $T_{DVW}$ in between the first data delay amount and the second data delay amount of the given pair. Accordingly, an average data delay amount that the skew correction controller 606 determines is a delay amount, by which to delay an adjustable data delay circuit 602, that positions sampling positions of the delayed clock signal CLK_d in target sampling positions when the clock delay of the adjustable clock delay circuit 604 is set to the reference clock delay amount.

Upon determining the one or more target data delay amounts, or at least upon determining the one or more second data delay amounts, the skew correction controller 606 may end a skew correction process. The skew correction controller 606 may set the adjustable data delay circuits 602 to the target data delay amounts immediately upon ending the skew correction process. In addition or alternatively, the skew correction controller 606 may record the target data delay amounts for later use.

Additionally, for some example configurations, the skew correction controller 606 may perform a skew correction process during or as part of a calibration process or procedure. The input data signals DQ that the sending circuit 102 sends to the receiving circuit 104 are calibration data signals that the sending circuit 102 wants the receiving circuit 104 to use to calibrate the adjustable delay circuits 602, 604. At a later time after the skew correction system 600 performs the skew correction process, the sending circuit 102 may have data that it wants the receiving circuit 104 to receive. For example, the receiving circuit 104 may include or have access to a memory array in which to store data, and the sending circuit 102 wants the data that it has to be stored in the memory array. The sending circuit 102 may send the data to the receiving circuit 104 in the form of the input data signals DQ. Prior to receiving the input data signals DQ, the receiving circuit 104 may set the clock delay of the adjustable clock delay circuit 604 to the reference clock delay amount, and may set the data delays of the adjustable data delay circuits 602 to the one or more target data delay amounts determined from the skew correction calibration process.

In addition, for particular example configurations where the receiving circuit 104 includes or otherwise has access to a memory array, the sending circuit 102 and the receiving circuit 104 may be configured to perform read operations and write (or program) operations. During a read operation, the sending circuit 102 and the receiving circuit 104 reverse their roles—the sending circuit 102 functions as the receiving circuit 102, and the receiving circuit 104 functions as the sending circuit 104. For a read operation, the receiving circuit 102 wants to receive data stored in the memory array to which the sending circuit 104 has access. The receiving circuit 102 may have sampling circuitry to sample the data signals it receives from the sending circuit 104 during the read operation. The receiving circuit 102 may further want to calibrate circuitry it has to optimally position sampling signals of clock signals the receiving circuit 102 receives from the sending circuit 104. The receiving circuit 102 may calibrate the circuitry during a calibration process called a read training process. To perform a read training process, the receiving circuit 102 provides the sending circuit 104 with a predetermined reference bit sequence. During a read training process, the sending circuit 104 outputs data signals to the receiving circuit 102 with the output data signals carrying the predetermined reference bit sequence. Since the receiving circuit 102 knows what the data values of the predetermined reference bit sequence should be, it uses the output data signals from received from sending circuit 104 to calibrate its circuitry so that it optimally samples data received from the sending circuit 104 during read operations.

On the other hand, during write operations, the sending circuit 102 and the receiving circuit 104 stay in their roles as previously described. For a write operation, the sending circuit 102 wants to send data to the receiving circuit 104 because it wants the receiving circuit 104 to store the data in the memory array to which it has access. Before performing a write operation, the receiving circuit 104 may calibrate the adjustable clock and data delay circuits 602, 604 to identify the reference clock delay amount and the target data delay amounts. As a calibration process for write operations, the skew correction process may be referred to as a write training process. For example embodiments where the skew correction system 600 performs skew correction processes as write training processes, the skew correction controller 606 may additionally or alternatively be referred to as a write training controller, as indicated in FIG. 6.

In particular example configurations, the reference bit sequence carried by the reference signal REF during write training processes may be the same as the predetermined reference bit sequence used during the read training process. For example, during a read training process, the sending circuit 104 may access the predetermined reference bit sequence stored in the reference data storage 616, and send data signals carrying the predetermined reference bit sequence to the receiving circuit 102. Then, during a write training process, the write training controller 606 may access the reference data storage 616 to generate the reference data signal REF. In other example configurations, the reference bit sequence carried by the reference signal REF during write training may be different from the predetermined reference bit sequence used during read training.

In addition, as shown in FIG. 6, the skew correction controller 606 may include a clock delay control circuit 618, an N-number of data delay control circuits 620(1) to 620(N), a reference data control circuit 622, an error identification circuit 624, a delay amount identification circuit 626, and a target data delay calculation circuit 628. The clock delay control circuit 618 is a component or module of the skew correction controller 606 that controls the delay of the adjustable clock delay circuit 604, such as through output of the clock delay control signal DC_C. In general, the clock delay control circuit 618 has the same functionality as the skew correction controller 606 to control the delay of the adjustable clock delay circuit 604. Accordingly, actions performed to control the delay of the adjustable clock delay circuit 604 may be interchangeably described or referred to as being performed by the skew correction controller 606 or the clock delay control circuit 618.

In addition, each of the data delay control circuits 620 is a component or module of the skew correction controller 606 that controls the delay of a respective adjustable data delay circuit 602, such as through output of a respective data delay control signal DC_DQ. In general, each data delay control circuit 620 has the same functionality as the skew correction controller 606 to control the delay of an adjustable data delay circuit 602. Accordingly, actions performed to control the delay of an adjustable data delay circuits 602 may be interchangeably described or referred to as being performed by the skew correction controller 606 or a respective data delay control circuit 620.

Also, FIG. 6 shows the skew correction controller 606 including an N-number of data delay control circuits 620(1) to 620(N), each configured to output a respective one of the N-number of control signals DC_DQ(1) to DC_DQ(N), or otherwise control a respective one of the N-number of adjustable data delay circuits 602(1) to 602(N). In other example configurations, the skew correction controller 606 may include less than an N-number of adjustable delay circuits, depending on how many different groups of adjustable data delay circuits the skew correction controller 606 is configured to independently control. As previously described, at minimum, the skew correction controller 606 is configured to independently control two different groups of adjustable data delay circuits, and so for such example configurations, the skew correction controller 606 includes a first data delay control circuit configured to control the delay of at least one first adjustable data delay circuit of a first group, and a second data delay control circuit configured to configured to control the delay of at least one second adjustable data delay circuit of a second group.

In addition, the reference data control circuit 622 is a component or module of the skew correction controller 606 that controls generation of the reference data signal REF and output or transmission of the reference data signal REF to the comparator circuit 612. The reference data control circuit 622 may be configured to access the reference bit sequence stored in the reference data storage 616, and generate the reference data signal REF in response to access of the reference data storage 616. In general, the reference data control circuit 622 has the same functionality as the skew correction controller 606 to control the generation and output of the reference data signal REF. Accordingly, actions performed to control the generation and output of the reference data signal REF may be interchangeably described or referred to as being performed by the skew correction controller 606 or the reference data control circuit 622.

Also, the error identification circuit 624 is a component or module of the skew correction controller 606 that identifies sampling errors from a sampling analysis, such as an M-bit comparison result signal CR, and determines whether the number of sampling errors has reached the first, second, or third threshold numbers. In general, the error identification circuit 622 has the same functionality as the skew correction controller 606 to identify the numbers of sampling errors and determine whether the numbers of sampling errors has reached the threshold numbers. Accordingly, actions performed to identify the numbers of sampling errors and determine whether the threshold numbers of sampling errors are reached at various points during skew correction processes may be interchangeably described or referred to as being performed by the skew correction controller 606 or the error identification circuit 622.

Additionally, the delay amount identification circuit 626 is a component or module of the correction controller 606 that identifies the reference clock delay amount, the one or more first data delay amounts, and the one or more second data delay amounts. The delay amount identification circuit 626 may communicate with the error identification circuit 624 and the clock and data control circuits 618, 620 in order to determine the reference clock delay amount and first and second data delay amounts. For example, the delay amount identification circuit 626 may receive notifications from the error identification circuit 624 that the first, second, and third threshold numbers of sampling errors are reached, and in response, identify a current clock delay amount from the clock delay control circuit 618 in order to determine the reference clock delay amount, and identify current data delay amounts from the data delay control circuit 620 in order to determine the first and second data delay amounts. In general, the delay amount identification circuit 626 has the same functionality as the skew correction controller 606 to identify the reference clock delay amount and the first and second data delay amounts. Accordingly, actions performed to identify the reference clock delay amount and the first and second data delay amounts at various points during skew correction processes may be interchangeably described or referred to as being performed by the skew correction controller 606 or the delay amount identification circuit 626.

In addition, the target data delay calculation circuit 628 is a component or module of the skew correction controller 606 that calculates or determines target data delay amounts, including average data delay amounts, during skew correction processes. The target data delay calculation circuit 628 may communicate with the delay amount identification circuit 626 to obtain the first and second data delay amounts in order to calculate the target data delay amounts. In general, the target data delay calculation circuit 628 has the same functionality as the skew correction controller 606 to determine or calculate the target data delay amounts during skew correction processes. Accordingly, actions performed to calculate the target data delay amounts may be interchangeably described or referred to as being performed by the skew correction controller 606 or the target data delay calculation circuit 628.

Also, as components or modules of the skew correction controller 622, each of the clock delay control circuit 618, the data delay control circuits 620, the reference data control circuit 622, the error identification circuit 624, the delay amount identification circuit 626, and the target data delay calculation circuit 628 may have any of the various hardware and/or combination of hardware and firmware (or hardware and software) configurations that the skew correction controller 606 can have in order to perform or carry out the various operation or functions of a skew correction process. For some example configurations, the circuits 618, 620, 622, 624, 626, 628 may include separate, discrete sets of circuitry, such as separate, discrete sets of logic circuits or other types of hardware circuits. For other example configurations, the circuits 618, 620, 622, 624, 626, 628 may include the same hardware circuitry, such as the same processor for example, but execute different firmware, such as different sets of computer code or instructions, in order carry out their respective functions, operations, or actions. Various configurations or combinations of configurations are possible for the circuits 618, 620, 622, 624, 626, 628 of the skew correction controller 606.

Figure 9:
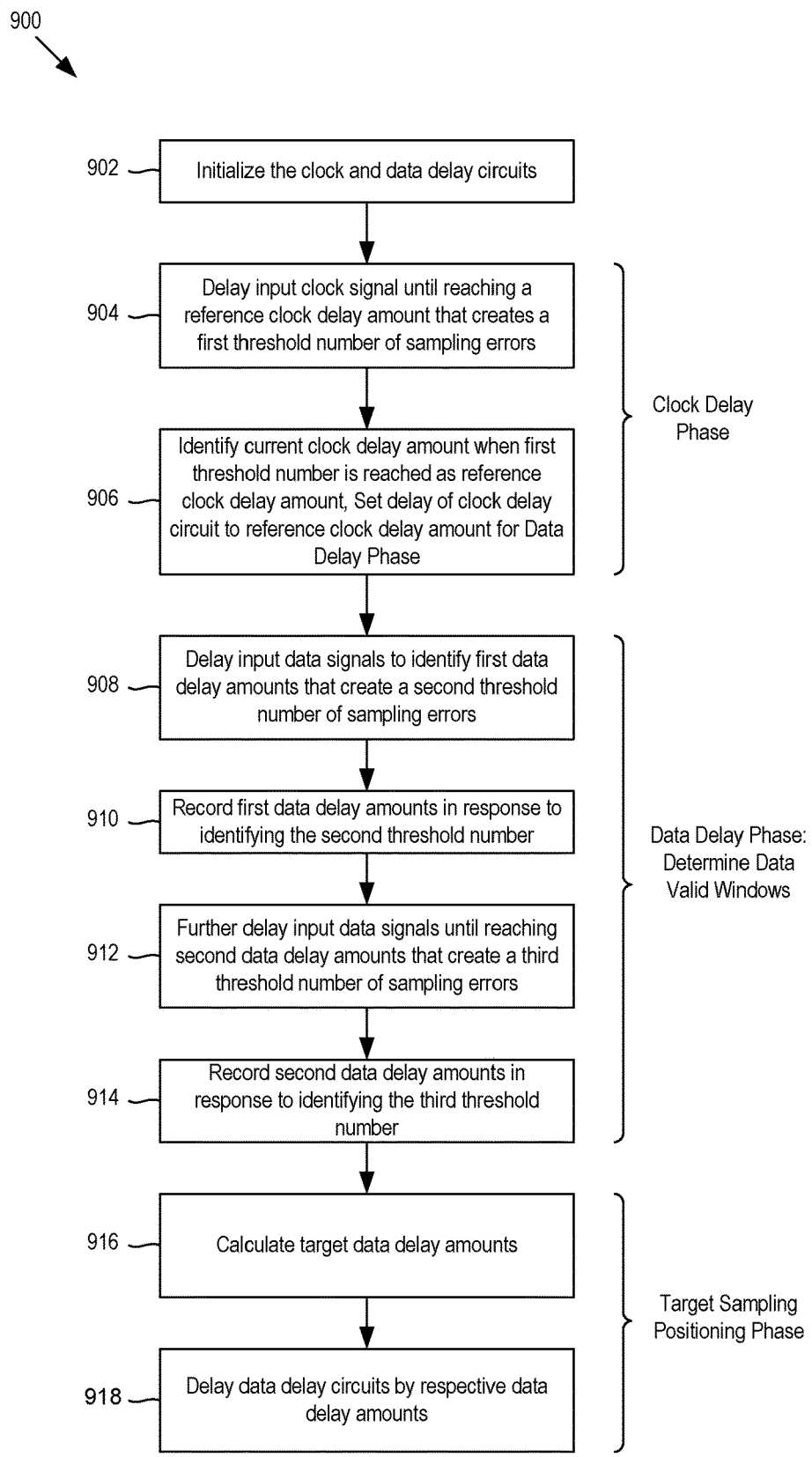
FIG. 9 is a flow chart of an example method of performing a skew correction process.

FIG. 9 shows a flow chart of an example method 900 of performing a skew correction process. The method 900 is described with reference to the skew correction system 600 of FIG. 6. At block 902, the skew correction controller 606, such as with the clock and data delay control circuit 918, 920, may initialize the adjustable data and clock delay circuits 602, 604, such as by setting their respective delays to initial amounts. In particular example methods, the initial amounts are minimum amounts.

Upon initializing the adjustable data and clock delay circuits 602, 604, the skew correction controller 606 may transition to a clock delay phase of the skew correction process. At block 904, the skew correction controller 606, such as with the clock delay control circuit 918, may control the clock delay circuit 604 to delay the input clock signal CLK until the skew correction controller 606, such as with the error identification circuit 624, identifies that a number of sampling errors reaches the first threshold number of sampling errors, as previously described. The skew correction controller 606 may control the adjustable clock delay circuit 604, such as with the clock delay control circuit 618, by increasing the clock delays over one or more iterations. During each iteration, the skew correction controller 606 may increase the clock delay of the adjustable clock delay circuit 604 by one or more increments.

During a given one of the iterations, the skew correction controller 606, such as with the error identification circuit 624, identifies that the number of sampling errors has reached the first threshold number. As previously described, the first threshold number may correspond to or indicate that a threshold number of the sampling circuits 610 is sampling the delayed data signals DQ_d with hold violations.

At block 906, in response to identification of the first threshold number, the skew correction controller 606, such as with the delay amount identification circuit 626, may identify a current clock delay amount by which the adjustable clock delay circuit 604 is delaying the input clock signal CLK. The skew correction controller 606 may identify the current clock delay amount as the delay amount that created the first threshold number of sampling errors, and in response, identify the current clock delay amount as the reference clock delay amount. If not set already, the skew correction controller 606, such as with the clock delay control circuit 618, may set the clock delay of the adjustable clock delay circuit 604 to the reference clock delay amount, and transition to the data delay phase.

The data delay phase may begin at block 908, with the skew correction controller 606, such as with the data delay control circuits 620, delaying the adjustable data delay circuits 602 to identify first data delay amounts that create the second threshold number of sampling errors, as previously described. During the data delay phase, the skew correction controller, such as with the clock delay control circuit 618, may maintain or hold constant the clock delay at the reference clock delay amount. In addition, the skew correction controller 606 may control the adjustable data delay circuits 602 by increasing the data delays over one or more iterations. During each iteration, the skew correction controller 606 may increase a data delay of at least one adjustable data delay circuit 602 by one or more increments.

During one or more iterations, the skew correction controller 606, such as with the delay identification circuit 624, identifies that the number of sampling errors has reached the second threshold number. In some example methods, the skew correction controller 606 may identify that the second threshold number is reached over a plurality of iterations. For example, where the skew correction controller 606 is configured to independently control the delay of different adjustable data delay circuits 602, the skew correction controller 606, such as with the delay identification circuit 624, may identify that the second threshold number is reached for different adjustable data delay circuits 602 during different iterations. As previously described, the second threshold number may indicate that a sampling circuit 610, or a threshold number of sampling circuits 610, is no longer sampling the delayed data signals DQ_d with hold violations.

At block 910, in response to identification of the second threshold number, the skew correction controller 606, such as with the delay amount identification circuit 626, may identify current data delay amounts by which the adjustable data delay circuits 602 are delaying the input data signals DQ. The skew correction controller 606 may identify the current data delay amounts as the delay amounts that created the second threshold number of sampling errors, and in response, identify the current data delay amounts as the first data delay amounts. As previously described, a first data delay amount may indicate an upper bound of a data valid window $T_{DVW}$. Accordingly, the first data delay amounts may identify upper bounds of respective data valid windows $T_{DVW}$, and in turn identify minimum delay amounts to delay respective adjustable data delay circuits 602 with the adjustable clock delay circuit 604 set to the reference clock delay amount in order to avoid a hold violation. The skew correction controller 606, such as with the delay amount identification circuit 626, may record the first data delay amounts for later calculation of target data delay amounts.

At block 912, the skew correction controller 606, such as with the data delay control circuits 620, may continue to delay the adjustable data delay circuits 602 until identifying second data delay amounts that create the third threshold number of sampling errors, as previously described. As with block 908, the skew correction controller 606 may continue to delay the adjustable delay circuits 602 by increasing the data delays over one or more iterations. During each iteration, the skew correction controller 606 may increase a data delay of at least one adjustable data delay circuit 602 by one or more increments.

During one or more iterations, the skew correction controller 606, such as with the delay identification circuit 624, identifies that the number of sampling errors has reached the third threshold number. In some example methods, the skew correction controller 606 may identify that the third threshold number is reached over a plurality of iterations. For example, where the skew correction controller 606 is configured to independently control the delay of different adjustable data delay circuits 602, the skew correction controller 606, such as with the delay identification circuit 624, may identify that the third threshold number is reached for different adjustable data delay circuits 602 during different iterations. As previously described, the third threshold number may indicate that a sampling circuit 610, or a threshold number of sampling circuits 610, is sampling the delayed data signals DQ_d with setup violations.

At block 914, in response to identification of the third threshold number, the skew correction controller 606, such as with the delay amount identification circuit 626, may identify current data delay amounts by which the adjustable data delay circuits 602 are delaying the input data signals DQ. The skew correction controller 606 may identify the current data delay amounts as the delay amounts that created the third threshold number of sampling errors, and in response, identify second data delay amounts based on the current data delay amounts. As previously described, a second data delay amount may indicate a lower bound of a data valid window $T_{DVW}$. Accordingly, the second data delay amounts may identify lower bounds of respective data valid windows $T_{DVW}$, and in turn identify maximum delay amounts to delay respective adjustable data delay circuits 602 with the adjustable clock delay circuit 604 set to the reference clock delay amount in order to avoid a setup violation. The skew correction controller 606, such as with the delay amount identification circuit 626, may record the second data delay amounts for later calculation of one or more target data delay amounts.

At block 916, the skew correction controller 606, such as with the target data delay calculation circuit 628, may calculate target data delay amounts based on the first and second data delay amounts. In particular example methods, the skew correction controller 606 averages a given pair of first and second data delay amounts to determine a target delay amount. As previously described, for a given pair of first and second data delay amounts, the first data delay amount may indicate an upper bound of a data valid window $T_{DVW}$ and the second data delay amount may indicate a lower bound of the data valid window $T_{DVW}$. Accordingly, the average of the first and second data delay amounts may indicate a middle position of the data valid window $T_{DVW}$. In turn, when a given ith adjustable data delay circuit 602(*i*) delays a given ith input data signal DQ(*i*) by the average data delay amount to generate an ith delayed data signal DQ(*i*)_d, and the adjustable clock delay circuit 604 delays the input clock signal CLK by the reference clock delay amount, the ith sampling circuit 610(*i*) sampling the ith delayed data signal DQ(*i*)_d receives sampling transitions of the delayed clock signal CLK_d in target sampling positions. At block 918, the skew correction controller 606, such as with the data delay control circuit 620, may set the delays of the adjustable data delay circuits 602 to the target data delay amounts.

The above described skew correction processes assume that the sampling circuits 610 all correctly sample their respective delayed data signals DQ_d with the adjustable data delay circuits 602 and the adjustable clock delay circuit 604 all having their respective delays set to initial, minimum delay amounts at the beginning of a skew correction process. However, during some skew correction processes, one or more of the sampling circuits 610 may generate one or more sampling errors at the beginning of a skew correction process when the delays of the adjustable delay circuits 602, 604 are set to minimum amounts. In such events, the skew correction controller 606 may not know whether the sampling errors are the result of a hold violation or a setup violations. If the sampling errors are the result of hold violations, then the skew correction controller 606 may continue to see sampling errors from the same sampling circuit 610 that initially produced the sampling errors as the skew correction controller 606 continues to increase the delay of the adjustable clock delay circuit 604. However, if the sampling errors are the result of setup violations, then the skew correction controller 606 may see the sampling errors disappear as the skew correction controller 606 continues to increase the delay of the adjustable clock delay circuit 604. The skew correction controller 606 may want to determine the reference clock delay amount differently, depending on whether the initially identified sampling errors are due to hold violations or setup violations.

Figure 10:
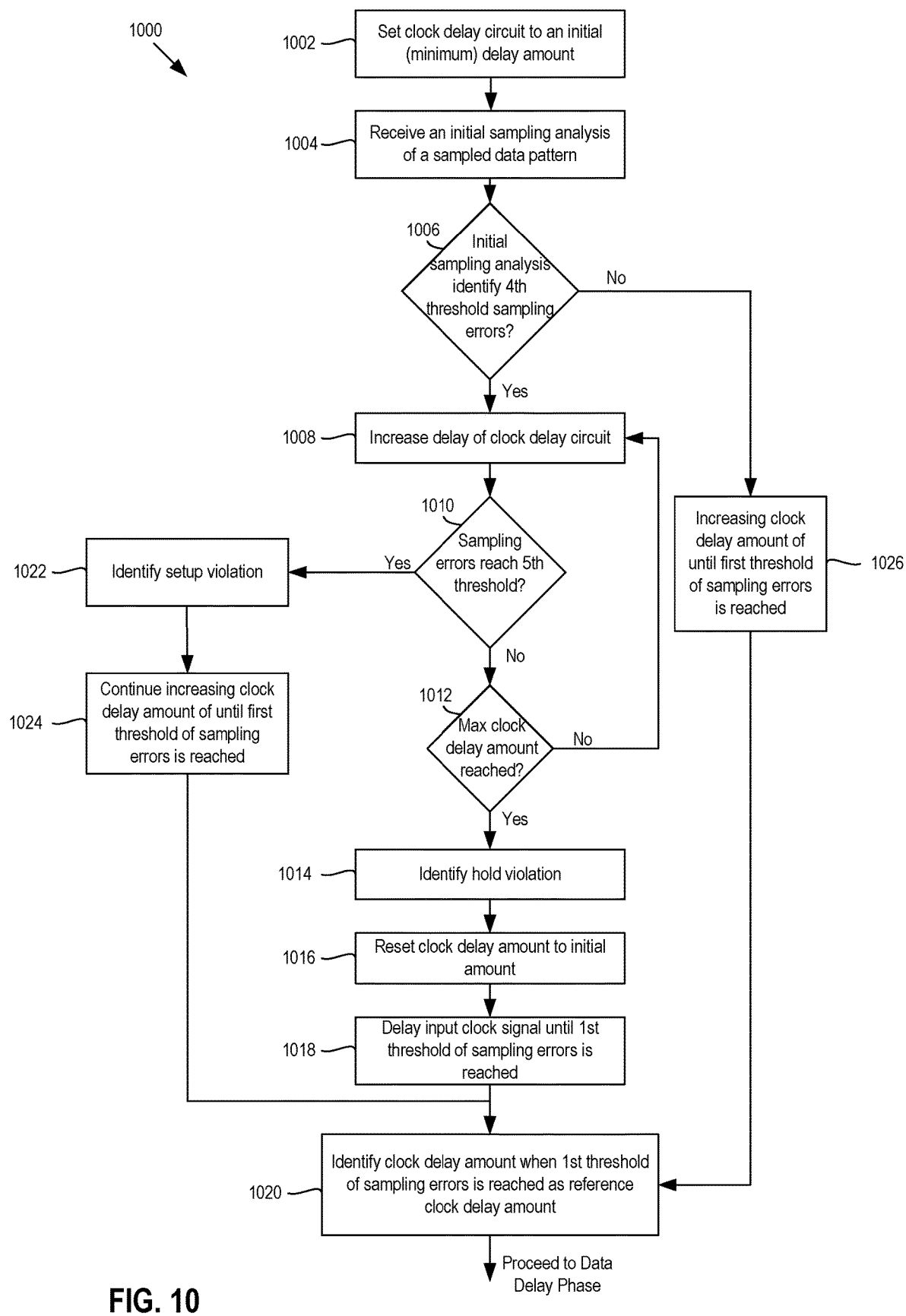
FIG. 10 is a flow chart of an example method of performing a clock delay phase of a skew correction process that accounts for sampling errors identified at the beginning of a skew correction process.

FIG. 10 is a flow chart of an example method 1000 of performing a clock delay phase of a skew correction process that accounts for sampling errors identified at the beginning of a skew correction process. The example method 1000 is described with reference to the skew correction system 600 of FIG. 6. At block 1002, the skew correction controller 606, such as with the clock delay control circuit 618 and the data delay control circuits 620, may set the delays of the adjustable delay circuits 602, 604 to initial, such as minimum, delay amounts.

At block 1004, the adjustable data delay circuits 602 may receive an initial set of data pulses of the input signals DQ, in turn leading to the comparator circuit 612 generating an initial sampling analysis, such as in the form of one or more M-bit comparison result signals CR. The skew correction controller 606, such as with the error identification circuit 624, may receive the initial sampling analysis from the comparator circuit 612. At block 1006, the skew correction controller 606, such as with the error identification circuit 624, may determine whether the initial sampling analysis identifies a number of sampling errors that greater than or equal to a fourth threshold number of sampling errors. The fourth threshold number may have a value that is the same as or different from any of the first, second, or third threshold numbers as previously described. In some example configurations, the fourth threshold number is one, although numbers of sampling errors more than one for the first threshold number may be possible.

If the skew correction controller 606, such as with the error identification circuit 624, identifies that the number of sampling errors is greater than or equal to the first threshold number, then the skew correction controller 606, such as with the error identification circuit 624, may identify which of the sampling circuits 610 is creating the sampling errors.

The method 1000 may proceed to block 1008, where the clock delay control circuit 618 begins increasing the delay of the adjustable clock delay circuit 604. During this time, the adjustable data delay circuits 602 and the adjustable clock circuit 604 may continue to receive pulses of the input data and clock signals DQ, CLK, leading to the continued generation of M-bit comparison result signals CR.

At block 1010, the skew correction controller 606, such as with the error identification circuit 624, may continue to receive the comparison result signals CR and identify numbers of sampling errors. During these iterations, the skew correction controller 606, such as with the error identification circuit 624, may determine whether the number of sampling errors has decreased down to a fifth threshold number. The fifth threshold number may have a value that is the same as or different from any of the first, second, or third threshold numbers, as previously described. In some example configurations, the fifth threshold number is zero, although numbers other than zero may be possible. If not, then the method 1000 may proceed to block 1012, where the skew correction controller 606, such as with the clock delay control circuit 618, may determine whether it has increased the delay of the adjustable clock delay circuit 604 to a maximum amount. If not, then the method 1000 may proceed back to block 1008, and the clock delay control circuit 618 may continue to increase the delay of the adjustable clock delay circuit 604.

Alternatively, at block 1012, if the skew correction controller 606, such as with the clock delay control circuit 618, determines that it has increased the delay of the adjustable clock delay circuit 604 to the maximum amount, then at block 1014, the skew correction controller 606, such as with the error identification circuit 624, may identify that the sampling errors resulted from a hold violation. In response, at block 1016, the skew correction controller 606, such as with the clock delay control circuit 618, may reset the delay of the adjustable clock delay circuit 604 to the initial, minimum amount. At block 1018, the skew correction controller 606 may repeat the clock delay phase and increase the delay of the adjustable clock delay circuit until the error identification circuit 624 identifies that the first threshold number of sampling errors is reached. While increasing the delay of the adjustable clock delay circuit 604, the skew correction controller 606, such as with the error identification circuit 624, may take into account the initial sampling errors that one or more of the sampling circuits 610 generated in response to initial hold violations. For example, at block 1018, the skew correction controller 606 may consider sampling errors for only those sampling circuits 610 that did not generate errors in the beginning as identified in the initial sampling analysis. At block 1020, when the first threshold number of sampling errors is reached, the skew correction controller 606, such as with the delay amount identification circuit 626, may identify a current clock delay amount as the reference clock delay amount. The skew correction process may then proceed to a data delay phase, as previously described with reference to FIG. 9

Referring back to block 1010, as the skew correction controller 606 increases the delay of the adjustable clock delay circuit 604, if the skew correction controller 606, such as with the error identification circuit 624, identifies that the number of sampling errors has reduced to the fifth threshold number, then the at block 1022, the skew correction controller 606, such as with the error identification circuit 624, may identify that the initial sampling errors identified in the initial sampling analysis were the result of setup violations. In response, the skew correction controller 606, such as with the clock delay control circuit 618, may continue to increase the delay of the adjustable clock delay circuit 604 until the skew correction controller 606, such as with the error identification circuit 624, identifies that the number of sampling errors has reached the first threshold number. Then method 1000 may then proceed to block 1020, where the skew correction controller 606, such as with the delay amount identification circuit 626, identifies the reference clock delay amount, as previously described.

Referring back to block 1006, if the initial sampling analysis does not identify a number of sampling errors reaching the fourth threshold number, then the method 1000 may proceed to block 1026, where the skew correction controller 606, such as with the clock delay control circuit 618, increases the delay of the adjustable clock delay circuit 604 until reaching the first threshold number of sampling errors. The method 1000 may then proceed to block 1020, where the skew correction controller 606, such as with the delay amount identification circuit 626, identifies the reference clock delay amount, as previously described.

Figure 11:
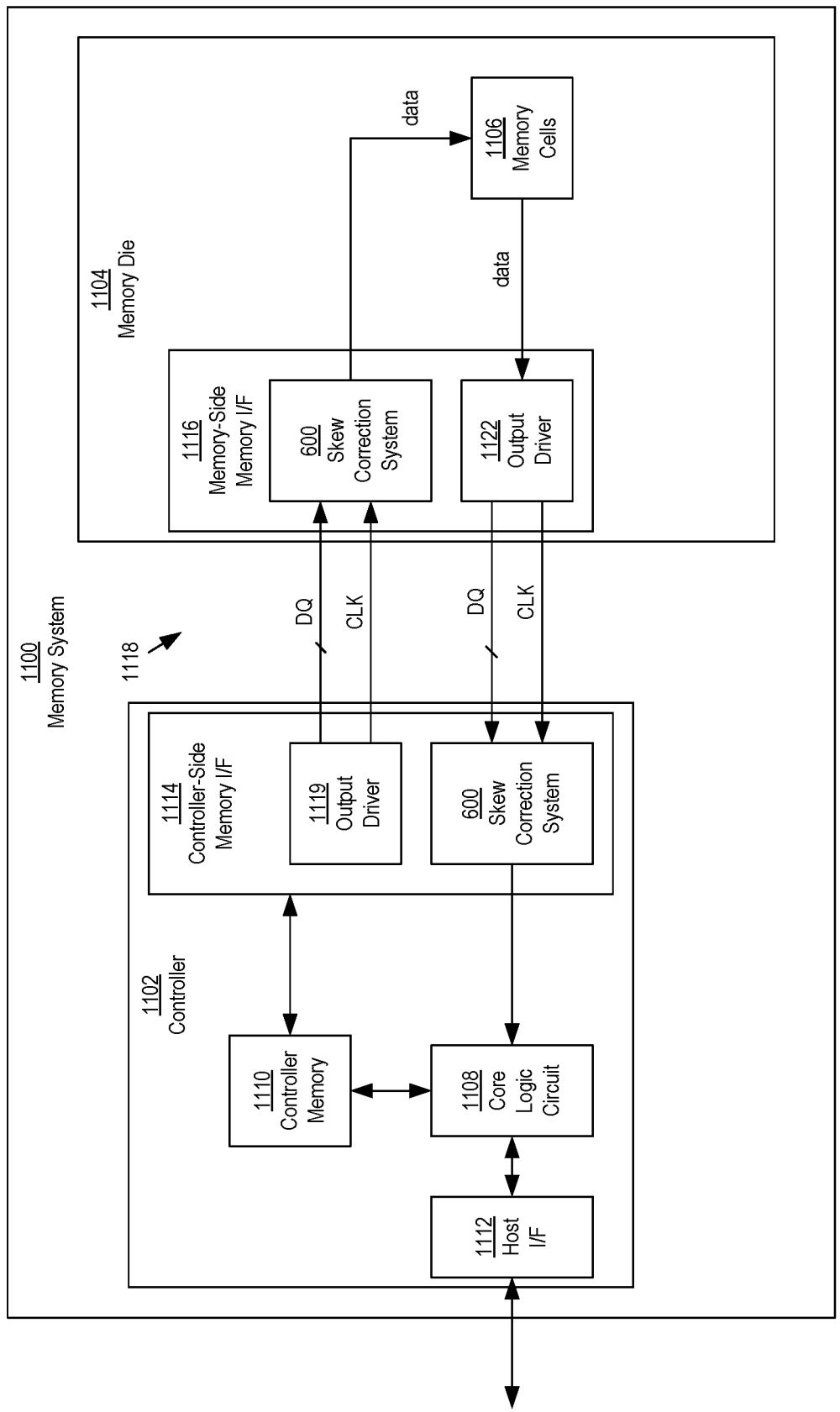
FIG. 11 is a block diagram of a memory system in which the skew correction system of FIG. 6 may be implemented.

FIG. 11 shows a block diagram of an example memory system 1100 that includes at least one skew correction system 600 as shown and described with reference to FIG. 6 and/or that may be representative of example configurations of the sending circuit 102 and the receiving circuit 104 of FIG. 1. The memory system 1100 may be configured to be connected to and/or in communication with a host system (not shown). The host system may be any electronic system or device that is configured to communicate and/or operate with the memory system 1100.

The memory system 1100 may include a controller 1102 and a memory die 1104. The memory die 1104 may include a memory cell structure 1106 of memory cells or elements, with each memory cell or element being configured to store one or more bits data. Any suitable type of memory cells can be used. As examples, the memory cells may be volatile memory such as dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), phase-change memory ("PCM"), other elements comprising semiconductor or other material capable of storing information, or various combinations thereof. Each type of memory may have different configurations. For example, flash memory may be configured in a NAND or a NOR configuration.

The memory cells can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/ or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

The controller 1102 may include a core logic circuit 1108. The core logic circuit 1108 may be configured to perform memory management functions, non-limiting examples of which may include, but not limited to, communicating with the host system, including receiving, handling, and responding to host requests or commands, such as read, write, erase, and status requests/commands received from the host system; error detection and correction (which may be part of handling host requests/commands); formatting the memory cells 1106 to ensure it is operating properly; mapping out bad memory cells; allocating spare cells to be substituted for future failed cells; wear leveling (distributing writes to avoid wearing out specific blocks of memory that would otherwise be repeatedly written to); garbage collection (after a block is full, moving only the valid pages of data to a new block, so the full block can be erased and reused); folding operations (moving data from a lower density memory area to a higher density memory area of the memory 1106); and transitioning the memory system 1100 between different states, operation modes, and/or power consumption modes. In operation, when the host system needs to read data from or write data to the memory 1106, it may communicate with the core logic circuit 1108. The core logic circuit 1108 may include hardware or a combination of hardware and software. For example, the core logic circuit 1108 may include a central processing unit, an application specific integrated circuit (ASIC), a field programmable gate array (FPGA), a digital logic circuit, an analog circuit, a combination of discrete circuits, gates, or any other type of hardware, or a combination thereof.

The controller 1102 may also include controller memory 1110, which may include volatile memory (e.g., random access memory (RAM)), non-volatile memory (e.g., read-only memory (ROM)), or a combination thereof. The controller memory 1110 may store software or firmware instructions and/or certain data structures, such as address translation data structures, that the core logic circuit 1108 may access and/or and execute to perform at least some of its memory management functions. Additionally, the core logic circuit 1108 may temporarily store data that is to be transferred to and stored in the memory cells 1106 such as in response to a host write command, and/or that was retrieved from the memory cells 1106 and is to be sent to the host system, such as in response to a host read command. FIG. 11 shows the controller memory 1110 as a component of the controller 1102, although in other example configurations, at least some of the controller memory 1110 may be a component of the memory system 1100 that is separate from the controller 1102. For example, the controller 1102 may be an integrated circuit, and depending on the configuration of the memory system 1100, the controller memory 1110 may be located on the integrated circuit, partially on the integrated circuit and partially separate from the integrated, or completely separate from the integrated circuit.

The controller 1102 may further include a host interface (I/F) 1112. The core logic circuit 1108 may be configured to communicate with a host system via a host interface 1112. In addition, the controller 1102 may include a controller-side memory interface (I/F) 1114 through which the controller 1102 is configured to communicate with the memory die 704. Similarly, the memory die 1104 may include a memory-side memory interface (I/F) 1116 through which the memory die 1104 is configured to communicate with the controller 1102. As shown in FIG. 11, the memory-side memory interface 1116 may include the skew correction system 600, although in other example configurations, the skew correction system 600 may be considered a component of the memory die 1104 separate from the memory-side memory interface 1116.

When the controller 1102 wants to program data stored in the memory cells 1106, such as in response to receipt of a host write or program request from the host system, the controller 1102 may send data signal DQ that includes the data to be programmed along with or in parallel with a clock signal CLK via communications bus 1118 that connects or couples the controller-side and memory-side memory interfaces 1114, 1116. In some example configurations, the controller-side memory interface 1114 may include an output driver 1119 to output the data signals DQ and the clock signal CLK.

As part of or in advance of a receiver-side training process, such as a receiver-side write training process or a receiver-side read training process, the controller 1102 may send one or more reference data signals, which the memory die 1104 may store as reference data bits in the memory cells 1106. The skew correction system 600 of the memory-side interface 1116 may then perform a skew correction process to determine delay amounts for the adjustable data and clock delay circuits that minimize skew. The skew correction system 600 may use the reference data bits in order to perform the skew correction process. After the skew correction process is performed, the memory system 1100 may enter into a normal operation mode in which the controller 1102 can instruct the memory die 1104 to write or program data into its memory cells 1106.

During programming, the sampling circuitry 608 included in or coupled to the skew correction system 600 may receive the delayed data and clock signals DQ_d, CLK_d from the adjustable data and clock delay circuits 602, 604 set to the target data delay and reference clock delay amounts, respectively. Since the sampling circuit 608 will receive data and clock signals that have been minimized for skew, it may more accurately identify the logic levels of the data to be programmed into the memory cells 1106 compared to if it received clock and data signals that were received from the controller 1102 without being subjected to the skew correction process.

Also, as shown in FIG. 11, in some example configurations, the controller 1102 may also include a skew correction system 600. FIG. 11 shows the skew correction system 600 of the controller 1102 as a component of the controller-side memory interface 1114, although other configurations may be possible. When the controller 1102 wants to read data stored in the memory cells 1106, the data may be communicated to an output driver circuit 1122 of the memory-side memory interface 1116. The output driver 1122 may transmit data signals DQ that includes the data along with a clock signal CLK. The controller 1102 may use the clock pulses of the clock signal CLK to identify the logic levels of the data signals DQ. The data and clock signals DQ, CLK from the memory die 1104 may be sent to the skew correction system 600 of the controller 1102, and the skew correction system 600 may delay the clock and data signals DQ, CLK by amounts determined from a prior skew correction process, and supply sampled data signals to the core logic circuit 1108.

The above-described skew correction process may help meet setup time and hold time requirements for high speed silicon applications. In some example configurations, the skew correction, performed in memory systems, may allow for the memory system to skip transmitter (Tx) side write training for the controller 1102, which may increase throughput for multi-die memory systems. In addition, the above described skew correction processes provided a flexible and effective receiver-side write training process for systems where such write training processes are required, rather than optional, in future memory systems. In addition, when performing skew correction using the above-described processes, I/O matching can be removed for data inputs (including powerbus), relatively simple circuits like input buffers may be removed, pin caps can be reduced. In addition, pad order may be reduced or adjusted—for example, the clock input pads and/or the data paths can be moved to the side of the memory die or reduced in number. Also, there may be no need for input buffer calibration for the data signals or the complementary clock signals. In turn, circuits relating to buffer calibration could possibly be removed. Additionally, the skew correction processes could improve or eliminate off-chip testing. In addition, the skew correction processes may reduce impact from off-chip controller/SI DQ mismatch.

A means for delaying an input clock signal until a clock delay reaches a reference clock delay amount that creates a threshold number of sampling errors, in various embodiments, may include a skew correction or a write training controller 606, a clock delay control circuit 618, an adjustable clock delay circuit 604, or the like. Other embodiments may include similar or equivalent means for delaying an input clock signal until a clock delay reaches a reference clock delay amount that creates a threshold number of sampling errors.

A means for delaying a first input data signal relative to the reference clock delay amount until a first data delay reaches a first target data delay amount, in various embodiments, may include a skew correction controller or a write training controller 606, a first of the data delay control circuits 620, a first of the adjustable data delay circuits 602, or the like. Other embodiments may include similar or equivalent means for delaying a first input data signal relative to the reference clock delay amount until a first data delay reaches a first target data delay amount.

A means for delaying a second input data signal relative to the reference clock delay amount until a second data delay reaches a second target data delay amount, in various embodiments, may include a skew correction controller or a write training controller 606, a second of the data delay control circuits 620, a second of the adjustable data delay circuits 602, or the like.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
   a clock delay circuit configured to delay an input clock signal with a clock delay to generate a delayed clock signal;
   a first data delay circuit configured to delay a first input data signal with a first data delay to generate a first delayed data signal;
   a second data delay circuit configured to delay a second input data signal with a second data delay to generate a second delayed data signal;
   sampling circuitry configured to sample the first delayed data signal and the second delayed data signal in response to receipt of the delayed clock signal;
   a clock delay control circuit configured to adjust the clock delay until the clock delay reaches a reference clock delay amount that creates a threshold number of sampling errors;
   a first data delay control circuit configured to adjust the first data delay relative to the reference clock delay amount until the first data delay reaches a first target data delay amount; and
   a second data delay control circuit configured to adjust the second data delay relative to the reference clock delay amount until the second data delay reaches a second target data delay amount.

2. The circuit of claim 1,
   wherein the sampling circuitry is configured to sample the first and second delayed data signals with hold violations to create the threshold number of sampling errors.

3. The circuit of claim 1, wherein the threshold number of sampling errors comprises a plurality of threshold numbers of sampling errors, each for a respective one of a plurality of sampling circuits of the sampling circuitry,
   wherein the clock delay control circuit is configured to adjust the clock delay until reaching a last of the plurality of threshold number of sampling errors.

4. The circuit of claim 1, wherein the threshold number of sampling errors comprises a first threshold number of sampling errors, wherein the first data delay control circuit, to adjust the first data delay, is configured to increase the first data delay relative to the reference clock delay amount, the circuit further comprising:
   a delay amount identification circuit configured to identify a first data delay amount of the first data delay that creates a second threshold number of sampling errors.

5. The circuit of claim 4, wherein the second data delay control circuit, to adjust the second data delay, is configured to increase the second delay relative to the reference clock delay amount, and
   wherein the delay amount identification circuit is further configured to identify a first data delay amount of the second data delay that creates the second threshold number of sampling errors.

6. The circuit of claim 4, wherein the first data delay control circuit, to adjust the first data, is further configured to increase the first data delay relative to the reference clock delay amount until the first data delay reaches a second data delay amount that creates a third threshold number of sampling errors.

7. The circuit of claim 6,
wherein the sampling circuitry is configured to sample the first delayed data signal with setup violations to create the second threshold number of sampling errors.

8. The circuit of claim 7, further comprising:
a target data delay calculation circuit configured to average the first data delay amount and the second data delay amount to determine the first target data delay amount.

9. The circuit of claim 1, wherein the threshold number of sampling errors comprises a first threshold number, the circuit further comprising:
an error identification circuit configured to:
determine that an initial sampled data signal comprises a second threshold number of sampling errors; and
wherein the clock delay control circuit is configured to:
adjust the clock delay until the clock delay reduces sampling errors to a third threshold number of sampling errors or a maximum delay is reached.

10. The circuit of claim 9, wherein the clock delay control circuit is further configured to:
in response to the clock delay reducing the sampling errors to the third threshold number, continue to increase the clock delay until the clock delay reaches the reference clock delay amount.

11. The circuit of claim 9, wherein the clock delay control circuit is further configured to:
in response to the maximum delay being reached, reset the clock delay to an initial delay amount; and
increase the clock delay to the reference clock delay amount.

12. The circuit of claim 1, further comprising:
a comparator circuit configured to:
compare a sampled bit sequence with a reference bit sequence for a read training process to determine the threshold number of sampling errors.

13. The circuit of claim 1
wherein the first data delay circuit comprises a plurality of delay blocks, each delay block comprising one of a plurality of delay chains, one of a plurality of bypass paths, and one of a plurality of selection circuits,
wherein the first data delay control circuit is configured to output a pair of complementary selection signals to the selection circuits to either enable or disable each of the plurality of bypass paths.

14. A circuit comprising:
a controller configured to:
receive a plurality of sampling analyses over a plurality of iterations of a skew correction process, the plurality of sampling analysis determined from sampling circuitry configured to sample a plurality of delayed data signals in response to receipt of a delayed clock signal;
during receipt of the sampling analyses, determine a plurality of data valid windows; and
calculate average delay amounts for a plurality of data delay circuits from the plurality of data valid windows, the plurality of data delay circuits configured to delay a plurality of input data signals to generate the plurality of delayed data signals.

15. The circuit of claim 14, wherein the controller is further configured to:

increase a delay of an adjustable clock delay circuit until the plurality of sampling analyses identify a threshold number of sampling errors; and
identify a reference clock delay amount that produced the threshold number of sampling errors.

16. The circuit of claim 15, wherein the controller is configured to determine the plurality of data valid windows with reference to the reference clock delay amount.

17. The circuit of claim 14, wherein the controller is further configured to:
increase delays of the plurality of data delay circuits to identify upper bounds of the plurality of data valid windows.

18. The circuit of claim 17, wherein the controller is further configured to:
further increase the delays of the plurality of data delay circuits to identify lower bounds of the plurality of data valid windows.

19. A system comprising:
an input circuit comprising a clock delay circuit configured to generate a delayed clock signal with a clock delay and a plurality of data delay circuits configured to generate a plurality of delayed data signals with a plurality of data delays; and
a write training controller configured to:
adjust the clock delay of the clock delay circuit until identifying a first threshold number of sampling errors created from sampling circuitry configured to sample the plurality of delayed data signals in response to the delayed clock signal;
set the clock delay to a reference clock delay amount that produces the first threshold number of sampling errors;
with the clock delay set to a reference clock delay amount that produces the first threshold number of sampling errors:
adjust the data delays of the plurality of data delay circuits to identify a plurality of first data delay amounts that produce a second threshold number of sampling errors; and
further adjust the data delays of the plurality of data delay circuits until identifying a plurality of second data delay amounts that produce a third threshold number of sampling errors;
determine a plurality of average delay amounts, each based on one of the plurality of first data delay amounts and the plurality of second data delay amounts; and
set the plurality of data delays of the plurality of data delay circuits each to a respective one of the plurality of average delay amounts.

20. The system of claim 19, further comprising:
a comparator circuit configured to:
compare a sampled bit sequence bit with a reference bit sequence for a read training process; and
generate a comparison result signal based on the comparison,
wherein the write training controller is configured to adjust the clock delay and the data delays in response to receipt of the comparison result signal.

21. A method comprising:
while maintaining a clock delay of a clock delay circuit and receiving an input clock signal and a plurality of input data signals:
increasing delays, with a controller, of a plurality of data delay circuits receiving the plurality of input data signals;

upon increasing the delays to first delay amounts, identifying, with the controller, a reduction of hold violations to a threshold number;

recording, with the controller, the first delay amounts;

upon increasing the delays to second delay amounts, identifying, with the controller, a threshold number of setup violations; and determining, with the controller, target delay amounts based on the first delay amounts and the second delay amounts.

22. A circuit comprising:

a means for delaying an input clock signal with a clock delay to generate a delayed clock signal;

a means for delaying a first input data signal with a first data delay to generate a first delayed data signal;

a means for delaying a second input data signal with a second data delay to generate a second delayed data signal;

a means for sampling the first delayed data signal in response to receipt of the delayed clock signal;

a means for sampling the second delayed data signal in response to receipt of the delayed clock signal;

a means for adjusting the clock delay until the clock delay reaches a reference clock delay amount that creates a threshold number of sampling errors;

a means for adjusting the first data delay relative to the reference clock delay amount until the first data delay reaches a first target data delay amount; and a means for adjusting the second data delay relative to the reference clock delay amount until the second data delay reaches a second target data delay amount.

* * * * *